United States Patent
Yoshida et al.

(10) Patent No.: US 7,015,841 B2
(45) Date of Patent: Mar. 21, 2006

(54) ANALOG TO DIGITAL CONVERTER CIRCUIT OF SUCCESSIVE APPROXIMATION TYPE OPERATING AT LOW VOLTAGE

(75) Inventors: Takeshi Yoshida, Hiroshima (JP); Atsushi Iwata, Hiroshima (JP); Mamoru Sasaki, Hiroshima (JP); Miho Akagi, Kanagawa (JP); Kunihiko Goto, Kanagawa (JP)

(73) Assignee: Semiconductor Technology Academic Research Center, Yokohama (JP)

( * ) Notice: Subject to any disclaimer, the term of this patent is extended or adjusted under 35 U.S.C. 154(b) by 0 days.

(21) Appl. No.: 11/029,492

(22) Filed: Jan. 6, 2005

(65) Prior Publication Data

US 2005/0200510 A1   Sep. 15, 2005

(30) Foreign Application Priority Data

Jan. 7, 2004   (JP) .......................... P2004-002449
Nov. 26, 2004   (JP) .......................... P2004-342508

(51) Int. Cl.
  *H03M 1/10*   (2006.01)
(52) U.S. Cl. ...................... 341/120; 341/172
(58) Field of Classification Search ............... 341/120, 341/172
  See application file for complete search history.

(56) References Cited

U.S. PATENT DOCUMENTS 5,606,320 A * 2/1997 Kleks ........................ 341/161
6,486,806 B1 * 11/2002 Munoz et al. .............. 341/120
6,603,415 B1 * 8/2003 Somayajula ................ 341/118
6,750,800 B1 * 6/2004 Yoshinaga .................. 341/172
6,850,181 B1 * 2/2005 Tsinker ...................... 341/163

OTHER PUBLICATIONS

Jens Sauerbrey et al., A 0.5V, 1 μW Successive Approximation ADC, Proceedings of 28th European Solid-State Circuit Conference (ESSCIRC 2002), Sep. 2002, pp. 247-250, Firenze, Italy.

Akira Matsuzawa, Explicative Paper, "CMOS Operational Amplifier," The IEICE Transaction on Electronics (C), The Institute of the Electronics, Information and Communications Engineers (IEICE) in Japan, May 2001, pp. 357-373, vol. J84-C, No. 5 (with partial English translation).

* cited by examiner

*Primary Examiner*—Linh Van Nguyen
(74) *Attorney, Agent, or Firm*—Birch, Stewart, Kolasch & Birch, LLP

(57) ABSTRACT

In a sampling and holding, a control logic circuit connects another end of each capacitor of a DA converter to a ground potential, and outputs a sampled input analog signal from a switched amplifier to one end of a hold capacitor to hold. In a successive approximation, it controls a switched amplifier to set an output terminal thereof to a high-impedance state and the hold capacitor to connect the one end thereof to the ground potential. Then, it switches over connection of another end of each capacitor from the ground potential to a power supply voltage based on a digital value held by a successive approximation register to output an output voltage from another end of the hold capacitor to a comparator, and compares the output voltage from another end thereof with an intermediate reference voltage to obtain a digital value from the successive approximation register.

10 Claims, 21 Drawing Sheets

ANALOG TO DIGITAL CONVERTER CIRCUIT OF SUCCESSIVE APPROXIMATION TYPE OPERATING AT LOW VOLTAGE

BACKGROUND OF THE INVENTION

1. Field of the Invention

The present invention relates to an analog to digital converter circuit (referred to as an AD converter circuit hereinafter) that converts an analog signal into a digital signal. In particular, the present invention relates to an AD converter circuit of successive approximation type.

2. Description of the Prior Art

In recent microstructure CMOS processes, a power supply voltage (Vdd) has been lowered according to a scaling rule of devices. In order to reduce a consumption power in a standby state of a large-scale digital circuit, however, a threshold voltage Vth of each of P channel MOSFETs and N channel MOSFETs that constitutes a CMOS device has not been reduced yet according to the scaling rule and a Vth/Vdd that is a ratio of the threshold voltage Vth to the power supply voltage Vdd is increasing. A CMOS device manufactured using, for example, 0.35 micrometer technique has a power supply voltage Vdd of 3.3 V and a threshold voltage Vth of 0.7 V. A CMOS device manufactured using, for example, 0.18 micrometer technique has a power supply voltage Vdd of 1.5 V and a threshold voltage Vth of about 0.5 V.

As for a logic LSI having CMOS devices integrated at high density, it is effective to reduce the power supply voltage Vdd so as to reduce the consumption power. However, as the Vth/Vdd ratio increases, an ordinary CMOS analog switch as configured by a P channel MOSFET and an N channel MOSFET cannot be used.

FIG. 21 is a circuit diagram showing a configuration of a conventional CMOS analog switch circuit. FIG. 22 is a graph showing an operation of the CMOS analog switch shown in FIG. 21, and shows conductances Gp and Gn of a MOSFET P101 and a MOSFET N101 relative to an input voltage Vin.

Referring to FIG. 21, a circuit, in which two MOSFETs P101 and N101 are connected in series, is inserted between an input terminal T101 and an output terminal T102, and a load capacitance Cload is connected to an output terminal T102. As shown in FIG. 22, when the input voltage Vin increases from 0 V, the conductance Gp of the P channel MOSFET P101 rises from 0 at a threshold voltage Vthp (it is noted that that a threshold voltage between the power supply voltage Vdd and the threshold voltage Vthp is referred to as a Vthpa) and the state of the MOSFET P101 is changed from an ON state to an OFF state. When the input voltage Vin is lowered from the power supply voltage Vdd, the conductance Gn of the N channel MOSFET N101 rises from 0 at a threshold voltage Vthn (it is noted that a threshold voltage between a grounding voltage Vss and the threshold voltage Vthn is referred to as a Vthna) and the state of the MOSFET N101 is changed from an ON state to an OFF state.

When the power supply voltage Vdd is lowered to, for example, 1V, the conductances Gp and Gn of the P channel MOSFET P101 and the N channel MOSFET N101 that constitute the CMOS analog switch shown in FIG. 21 decreases at the input voltage Vin near Vdd/2 even if the P channel MOSFET P101 and the N channel MOSFET N101 are turned on, and this leads to that the CMOS analog switch is not turned on. In such conditions, there is caused such a problem that it is difficult to realize an AD converter circuit or a digital to analog converter (referred to as a DA converter hereinafter) using an analog switch.

In order to solve the above-mentioned problem, when the threshold voltage Vth of the MOSFET is lowered, the ON resistance thereof decreases but an OFF resistance is not sufficiently high so that a leak current increases. This leads to that the analog switch cannot be used. As another method for solving this problem, there has been known to those skilled in the art, a method for raising a gate voltage of each MOSFET that constitutes the analog switch to be higher than the power supply voltage Vdd. In order to implement this method, there has been provided a method for obtaining a high gate voltage using a charge pump, and further, there has been provided a bootstrapping method for obtaining a high gate voltage by holding electric charges charged into a capacitor and connecting the capacitor to a power supply in series. However, these methods requires a device having a withstand voltage higher than that of an ordinary device, and this leads to such problems as complication of the process, deterioration of the reliability, and increase in the circuit area.

FIG. 23 is a circuit diagram showing a configuration of an AD converter circuit according to a first prior art example. FIG. 24 is a circuit diagram showing a configuration of a DA converter 16 of capacitor array type shown in FIG. 23. The AD converter circuit shown in FIG. 23 is configured to include the DA converter 16 of capacitor array type, a comparator 13, a successive approximation register (SAR) 14, and a control logic circuit 15. In the DA converter 16 of capacitor array type shown in FIG. 23, respective capacitors 160-0 to 160-N of the capacitor array also function as capacitors for sampling and holding. Furthermore, the DA converter 16 of capacitor array type is configured to include the capacitors 160-0 to 160-N and CMOS analog switches 161-0 to 161-N respectively connected to the respective capacitors 160-0 to 160-N. Thus, numerous LSIs have been developed using the CMOS techniques.

In the DA converter 16 of capacitor array type shown in FIG. 24, the switches 161-0 to 161-N connected to a reference voltage Vrefp having a higher potential (e.g., the power supply voltage source Vdd) or a reference voltage having a lower potential (e.g., the grounding voltage Vss) can be realized by P channel MOSFETs or N channel MOSFETs, respectively. In addition, each switch is configured as a grounded switch having one end grounded or being connected to the higher-potential power supply voltage source, so that the switch can be turned on and off even at a low power supply voltage. However, the potentials at both ends of each of a switch 162 and the switches 161-0 to 161-N are in a floating state, and this leads to that at the lower power supply voltage shown in FIG. 21, the ON resistance of each switch is quite high and the switch does not operate normally.

In order to solve above-mentioned problems, in a non-patent document of Jens Sauerbrey et al., "A 0.5V, 1 mW Successive Approximation ADC", Proceedings of 28th European Solid-State Circuit Conference (ESSCIRC 2002), September 2002, Firenze, Italy, pp. 247–250, there is proposed an AD converter circuit of successive approximation type that operates at a low voltage like about 1V using a DA converter based on a grounded switch (referred to as a second prior art example hereinafter). FIG. 25 is a circuit diagram showing a configuration of the AD converter circuit according to the second prior art example, and FIG. 26 is a circuit diagram showing a configuration of a DA converter 19 of capacitor array type shown in FIG. 25. As shown in FIG. 25, the AD converter circuit according to the second prior art example is configured to include the following components:

(a) A sample hold circuit 18 that samples an input analog signal inputted via an analog signal input terminal 90a, and that holds a sample value until end of AD conversion.

(b) A DA converter 19 of capacitor type.

(c) A comparator 13 that compares an output voltage 18a from the sample hold circuit 18 with an output voltage 19a from the DA converter 19, and that outputs a comparison result signal.

(d) A successive approximation register (SAR) 14 that controls the DA converter 19 based on the comparison result signal from the comparator 13.

(e) A control logic circuit 15 that controls operation timings of the respective circuits 13, 14, 18 and 19.

As shown in FIG. 25, the DA converter 19 is configured to include the following components:

(a) Capacitors 190-0 to 190-N having capacitances $C_o$ to $C_N$, respectively.

(b) Switches 191-1 to 191-N for selectively connecting the respective capacitors 190-0 to 190-N to either a reference voltage source Vrefp having a higher potential or a reference voltage source Vrefn having a lower potential.

(c) A switch 192-0 for grounding the output voltage 19a from the DA converter 19 via a capacitor 192-1.

(d) The capacitor 192-1 having a capacitance Cs for attenuating or damping the maximum value of the output voltage 19a from the DA converter 19 to Vdd/2.

Assuming that $C_0 = C_{unit}$ is a unit capacitance, respective capacitances $C_i$ (i=1, 2, ... N) are set as represented by the following Equations (1) to (3):

$$C_1 = C_0 = C_{unit} \quad (1),$$

$$C_{i+1} = 2C_i \ (i=1, 2, \ldots, N-1) \quad (2),$$

and $$C_S = 2C_N \quad (3).$$

Each of the switches 191-1 to 191-N of the DA converter 19 is a grounded switch connected to the reference voltage source Vrefp having the higher potential or the reference voltage source Vrefn having the lower potential. Therefore, the switch having the higher potential can be realized by a P channel MOSFET, and the switch having the lower potential can be realized by an N channel MOSFET. Each of the switches can be turned on and off even at a lower power supply voltage.

Further, the maximum output voltage $V_{19amax}$ from the DA converter 19 is obtained when the switches 191-1 to 191-N are connected to the higher-potential reference voltage source Vrefp, and then, it is represented by the following Equation (4):

$$V_{19max} = Vrefp \times (C_N + C_{N-1} + \ldots + C_1 + C_0) /$$
$$(C_S + C_N + C_{N-1} + \ldots + C_1 + C_0)$$
$$= Vrefp/2 \quad (4)$$

Therefore, the input signal of the AD converter circuit is ranged from a voltage Vrefn to a voltage Vrefp/2. In order to enlarge the input voltage range, a voltage of the higher-potential power supply voltage source Vrefp is set to be equal to that of the power supply voltage source Vdd, and a voltage of the lower-potential power supply voltage source Vrefn is set to be equal to a ground potential (0 V). In this case, the input signal range is ranged from 0 V to the voltage Vdd/2.

The AD converter circuit of capacitor array successive approximation type using the ordinary analog switches according to the first prior art example can not operate at a voltage equal to or lower than 1 V since the switches are not turned on at 1V or lower. The AD converter circuit according to the second prior art example that is an improvement of the AD converter circuit according to the first prior art example can operate at a power supply voltage of 1 V. However, the input voltage range is limited to a range from the ground potential to the voltage Vdd/2. In addition, the comparator 13 should operate at a high rate at the input voltage in a relatively wide common mode voltage range from 0 V to the voltage Vdd/2. It is difficult to realize the differential comparator 13 that operates at such a wide common mode voltage by an ordinary circuit configuration.

The comparator 13 shown in FIG. 25 sets the output voltage 18a from the sample hold circuit 18 as a reference voltage, and compares the reference voltage with the output voltage 19a from the DA converter 19a. In order to set the voltage range of the analog input signal of the AD converter circuit from the ground potential to the voltage Vdd of the power supply voltage source, it is necessary for the comparator 13 to compare a minor potential difference in a wide voltage range from a voltage near the ground potential to the voltage Vdd. It is difficult to realize this by the comparator 13 with the ordinary circuit configuration. Furthermore, when the comparator 13 is configured using a rail to rail amplifier circuit (having a full range from a lower limit voltage to a higher limit voltage of the power supply), there is a possibility that the input voltage range may be able to be enlarged. However, this leads to such problems as complication of the circuit configuration, decrease in the operation rate, and increase in the power consumption.

SUMMARY OF THE INVENTION

It is an object of the present invention to provide an AD converter circuit of successive approximation type capable of solving the above-mentioned problems, reducing a power supply voltage to a low voltage equal to or lower than 1 V, and enlarging an input analog voltage range to a range from a ground potential to a voltage Vdd.

According to a first aspect of the present invention, there is provided an analog to digital converter circuit including a sample hold circuit, a digital to analog converter, a comparator, a successive approximation register, and a controller. The sample hold circuit samples and holds an input analog signal, and the digital to analog converter converts a digital value into an analog voltage, and outputs the analog voltage. The comparator compares the input analog voltage with the analog voltage from the digital to analog converter, and outputs a comparison result signal, and the successive approximation register holds the comparison result signal from the comparator, and outputting a held digital value thereof. The controller controls an operation of the analog to digital converter circuit.

The digital to analog converter is of capacitor array type and includes a plurality of capacitors, and a plurality of switches. Each of the plurality of capacitors have one end connected to a common terminal, and the capacitors have capacitances different from each other, respectively. The plurality of switches switch over the plurality of capacitors so as to select one of the capacitors.

The sample hold circuit includes a switched amplifier, and a hold capacitor. The switched amplifier is operable to switch over its operation so as to select one of an operation of sampling and outputting the input analog signal and another operation of setting an output terminal of the switched amplifier into a high-impedance state. The hold capacitor has one end and another end connected in series to a common terminal of the respective capacitors, and the hold capacitor holds the sampled input analog signal outputted from the switched amplifier.

During sampling and holding of the input analog signal, the controller connects another end of each of the capacitors of the digital to analog converter to a first potential, and outputs the sampled input analog signal from the switched amplifier to the one end of the hold capacitor so that the hold capacitor holds the sampled input analog signal. Thereafter, during successive approximation of the comparison result signal, the controller controls the switched amplifier so that the output terminal of the switched amplifier is set into the high-impedance state, controls to connect the one end of the hold capacitor to the first potential, successively switches over connection of another end of each of the capacitors of the digital to analog converter from the first potential to a second potential higher than the first potential based on the digital value held by the successive approximation register to output an output voltage from another end of the hold capacitor to the comparator as the output voltage from the digital to analog converter. Then, the controller controls the comparator to compare the output voltage from another end of the hold capacitor with a third potential that is a potential between the first potential and the second potential to obtain a digital value from the successive approximation register.

According to a second aspect of the present invention, there is provided an analog to digital converter circuit including a sample hold circuit, a digital to analog converter, a comparator, a successive approximation register, and controller. The sample hold circuit samples and holds an input analog voltage, and the digital to analog converter converts a digital value into an analog voltage, and outputs the analog voltage. The comparator compares the input analog voltage with the analog voltage from the digital to analog converter, and outputs a comparison result signal, and the successive approximation register holds the comparison result signal from the comparator, and outputs a held digital value. Then, the controller controls an operation of the analog to digital converter circuit.

The digital to analog converter is of capacitor array type and includes a plurality of capacitors, and a plurality of switches. The plurality of capacitors each have one end connected to a common terminal, the capacitors have capacitances different from each other, respectively. The plurality of switches switch over the plurality of capacitors so as to select one of the capacitors.

The sample hold circuit includes a switched amplifier, and a hold capacitor. The switched amplifier is operable to switch over its operation so as to select one of an operation of sampling and outputting the input analog signal and another operation of setting an output terminal of the switched amplifier into a high-impedance state. The hold capacitor has one end and another end connected in series to a common terminal of the respective capacitors, and the hold capacitor holds the sampled input analog signal outputted from the switched amplifier.

During sampling and holding, the controller connects another end of each of the capacitors of the digital to analog converter to a second potential higher than a first potential, and outputs the sampled input analog signal from the switched amplifier to the one end of the hold capacitor so that the hold capacitor holds the sampled input analog signal. Thereafter, during successive approximation, the controller controls the switched amplifier so that the output terminal of the switched amplifier is set into the high-impedance state, and controls the one end of the hold capacitor to be connected to the second potential. The controller successively switches over connection of another end of each of the capacitors of the digital to analog converter from the second potential to the first potential based on the digital value held by the successive approximation register to output an output voltage from another end of the hold capacitor to the comparator as the output voltage from the digital to analog converter, and controls the comparator to compare the output voltage from another end of the hold capacitor with a third potential that is a potential between the first potential and the second potential to obtain a digital value from the successive approximation register.

The above-mentioned analog to digital converter circuit preferably further includes an additional hold capacitor being connected in parallel to the hold capacitor during the successive approximation.

In the above-mentioned analog to digital converter circuit, the switched amplifier is preferably configured such that the output voltages of the same number as the number of the plurality of capacitors of the digital to analog converter are outputted to and held by the respective capacitors of the digital to analog converter.

In the above-mentioned analog to digital converter circuit, the sample hold circuit and the digital to analog converter of the analog to digital converter circuit are preferably configured by differential circuits, respectively, so that differential input analog signals are converted into digital values.

In the above-mentioned analog to digital converter circuit, the analog to digital converter circuit is preferably configured by a CMOS circuit that includes P channel MOSFETs and N channel MOSFETs. In this case, the first potential is set to one potential in a range from a ground potential to a potential represented by {(the ground potential)+(a threshold voltage of each of the N channel MOSFETs)}, and the second potential is set to one potential in a range from a positive power supply voltage to a potential represented by {(the positive power supply voltage)−(an absolute values of a threshold voltage of each of the P channel MOSFETs)}.

Accordingly, the analog to digital converter circuit according to the present invention can realize the switched amplifier by the grounded switches operating at the low voltage, namely, by a rail to rail amplifier operable at input and output voltages in a range from the ground potential to the power supply voltage. Further, by outputting the output voltage from the hold capacitor of the sample hold circuit as the output voltage from the digital to analog converter via a common terminal thereto, and comparing the output voltage from the digital to analog converter with the appropriately set third potential using the comparator, the analog to digital converter circuit according to the present invention can perform a successive approximation operation and the digital to analog conversion. Since it suffices that the comparator detects only the difference between the reference voltage having the third potential and the output voltage from the digital to analog converter, the comparator can be configured by a simple circuit configuration. In addition, since the analog to digital converter circuit does not depend on a direct-current voltage of the input analog signal, the input voltage range of the analog to digital converter circuit can be set to the range from the ground potential to the voltage of the power supply voltage source. In the other words, the analog to digital converter circuit according to the present invention can operate at the power supply voltage equal to or lower than 1 V, and enlarges the input analog signal voltage range to the range from the ground potential to the voltage of the power supply voltage source. In addition, the analog to digital converter circuit can realize the comparator by the comparator having the narrow common-mode input voltage range, and execute a high-accuracy conversion without any influence of the offset voltage of the comparator and any influence of the parasitic capacitor of the capacitor array.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DESCRIPTION OF THE PREFERRED EMBODIMENTS

Preferred embodiments according to the present invention will be described hereinafter with reference to the drawings. The components similar to each other are denoted by the same numerical references, respectively.

First Preferred Embodiment

Figure 1:
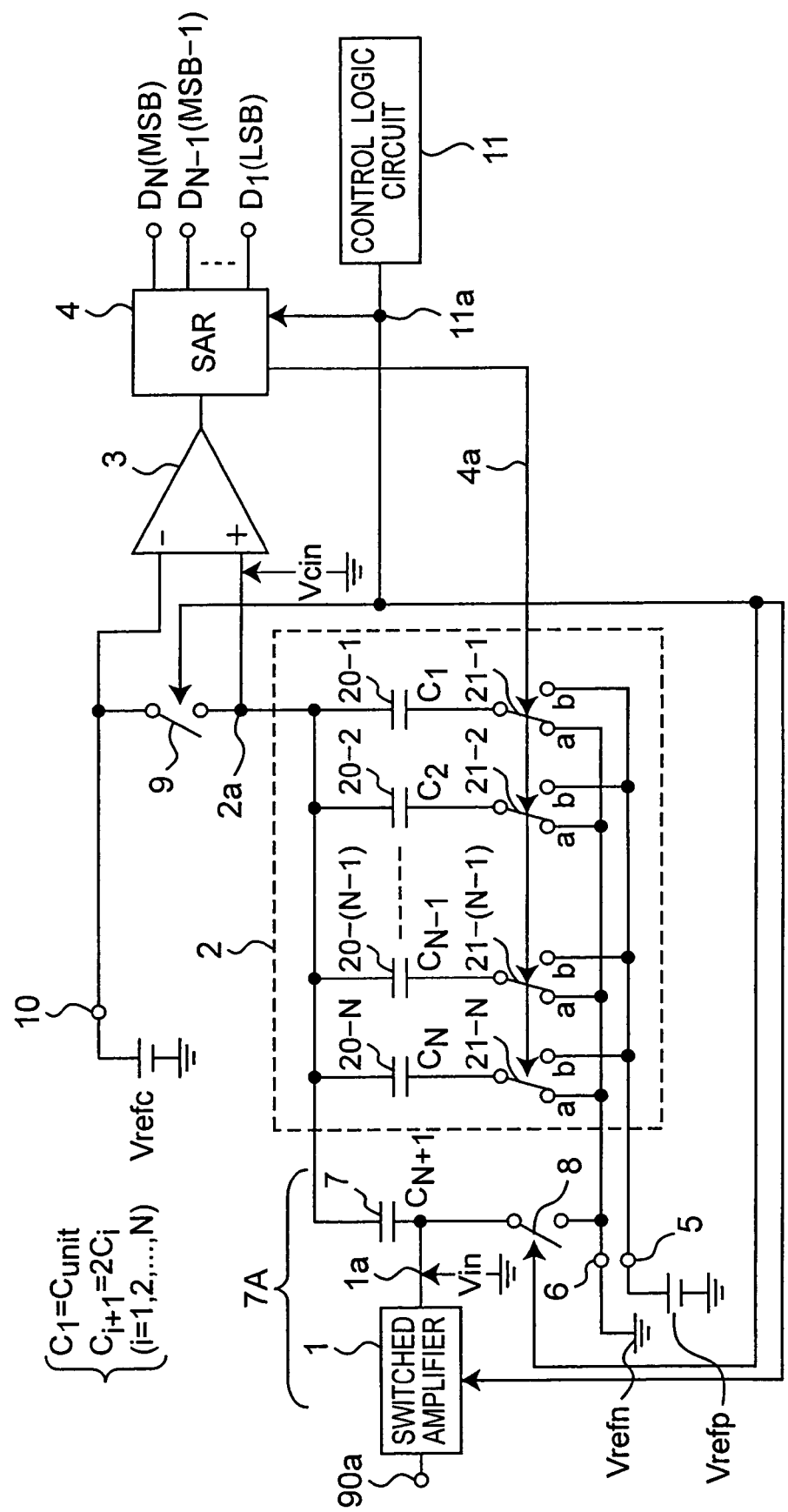
FIG. 1 is a circuit diagram showing a configuration of an AD converter circuit according to a first preferred embodiment of the present invention.

FIG. 1 is a circuit diagram showing a configuration of an AD converter circuit according to a first preferred embodiment of the present invention. The AD converter circuit according to the first preferred embodiment is an AD converter of successive approximation type that includes a local DA converter 2 using grounded switches each having one end connected to a ground potential (or a potential near the ground potential) Vrefn or a reference voltage source Vrefp, a sample hold circuit 7A as configured by a switched amplifier 1 and a hold capacitor 7, and a comparator 3 as configured to be simpler to have a less wide common-mode input voltage range than that of the prior art examples. The AD converter circuit according to the first preferred embodiment is characterized by being able to operate at a power supply voltage Vdd equal to or lower than 1 V.

Figure 25:
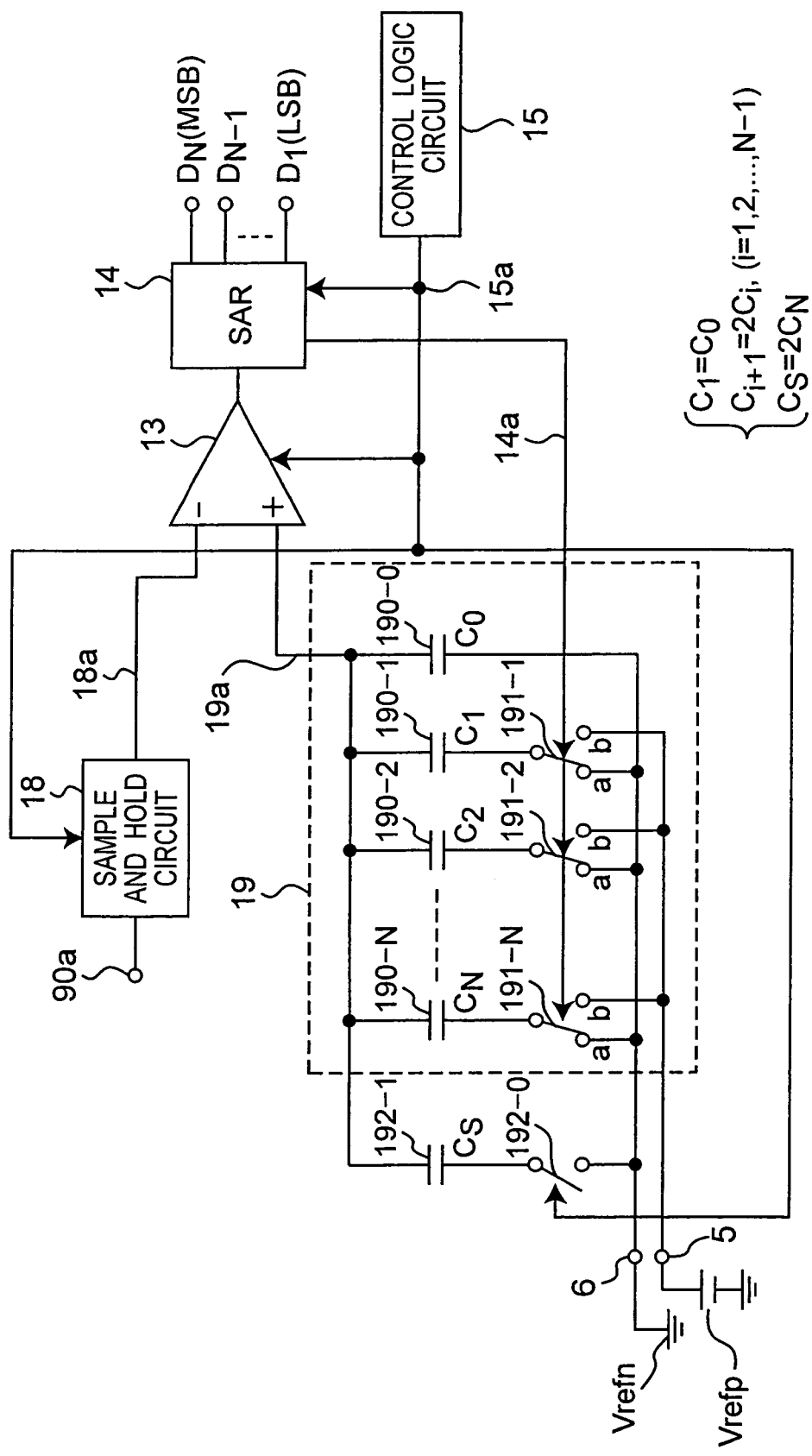
FIG. 25 is a circuit diagram showing a configuration of an AD converter circuit according to a second prior art example.
Figure 26:
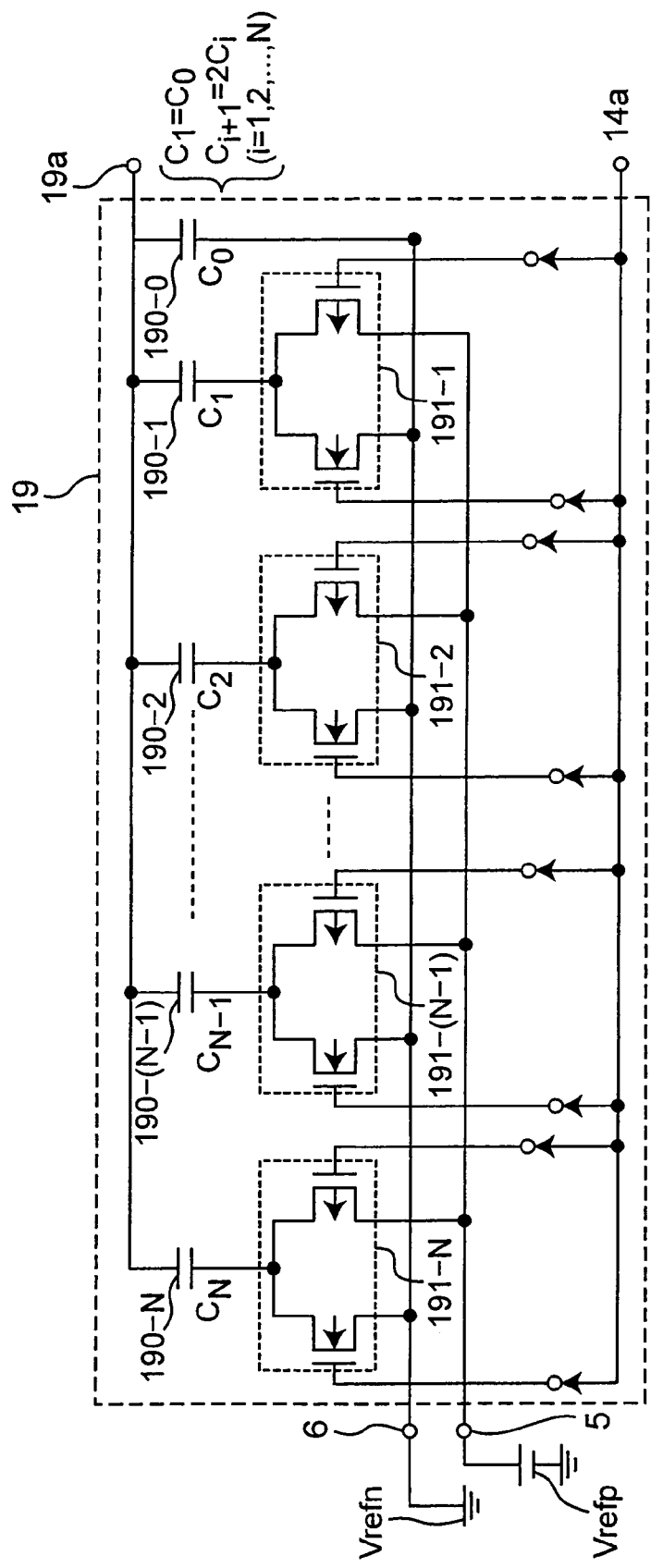
FIG. 26 is a circuit diagram showing a configuration of a DA converter 19 of capacitor array type shown in FIG. 25.

Referring to FIG. 1, the switched amplifier 1 samples an input analog signal inputted via an input analog signal terminal 90a, and outputs the sampled signal to the hold capacitor 7 having a capacitance $C_{N+1}$ holding a sample value of the sampled signal. The sample hold circuit 7A is configured by the switched amplifier 1 and the hold capacitor 7. The DA converter 2 is configured to include N capacitors 20-1 to 20-N, and N switches 21-1 to 21-N having common terminals connected in series to the respective N capacitors 20-1 to 20-N, respectively, where the N switches 21-1 to 21-N are controlled by a successive approximation register (SAR) 4 that serves as a second controller of the AD converter circuit using a control signal 4a. The capacitors 20-1 to 20-N have capacitances $C_1$ to $C_N$ different from each other, respectively, and the respective capacitances $C_1$ to $C_N$ are set in a manner similar to that of the Equations (1) and (2) according to the second prior art example. A sampled voltage from the switched amplifier 1 is applied to on end of the hold capacitor 7. In addition, one end of the hold capacitor 7 is connected to a reference voltage source Vrefn via a switch 8 and a terminal 6 controlled by a control logic circuit 11 that is configured by an N-channel MOSFET and serves as a first controller of the AD converter circuit using a control signal 11a. The reference voltage source Vrefn is, for example, a ground potential, as shown. Alternatively, the reference voltage source Vrefn may be an intermediate potential in a range from the ground potential to a threshold voltage Vthna shown in FIG. 25, as described later in details.

The terminal 6 is connected to contacts "a" of the respective switches 21-1 to 21-N of the DA converter 2, and contacts "b" thereof are grounded via a terminal 5 and a reference voltage source Vrefp. As shown in FIG. 1, the reference voltage source Vrefp has a voltage such as Vrefp or the like. Alternatively, the voltage of the reference voltage source Vrefp may be an intermediate potential in a range from a power supply voltage source Vdd to a threshold voltage Vthnp (=Vdd−Vthnpa) shown in FIG. 25. Another end of the hold capacitor 7 is connected to one end of each of the capacitors 20-1 to 20-N of the DA converter 2 and a non-inverting input terminal of the comparator 3, and is also connected to an inverting input terminal of the comparator 3 via a switch 9 controlled by the control logic circuit 11 as configured by, for example, an N channel MOSFET. The non-inverting input terminal of the comparator 3 is connected to an intermediate reference voltage source Vrefc via a terminal 10. A voltage (referred to as an intermediate reference voltage Vrefc hereinafter) of the intermediate reference voltage source Vrefc is set to a voltage at which the comparator 3 and the switch 9 are operable. That is, the intermediate reference voltage Vrefc is set to an intermediate potential between the ground potential and a potential of the power supply voltage source Vdd, e.g., near the voltage of Vdd/2.

The comparator 3 compares an output voltage 2a from the DA converter 2 with the intermediate reference voltage Vrefc, and outputs a comparison result signal to the successive approximation register 4. The successive approximation register 4 holds and outputs digital values $D_1$ to $D_N$ based on the comparison result signal from the comparator 3, and controls the switches 21-1 to 21-N of the DA converter 2 using the control signal 4a based on the held digital values, respectively. In the AD converter circuit according to the present preferred embodiment, the successive approximation register 4 and the control logic circuit 11 execute a successive approximation process using a successive approximation algorithm to be described later, so as to obtain the digital values supplied to the DA converter 2, and then, output digital signals $D_1$ to $D_N$ each indicating the digital values outputted after the AD conversion when the comparator 3 and the successive approximation register 4 finish the successive approximation.

Figure 2:
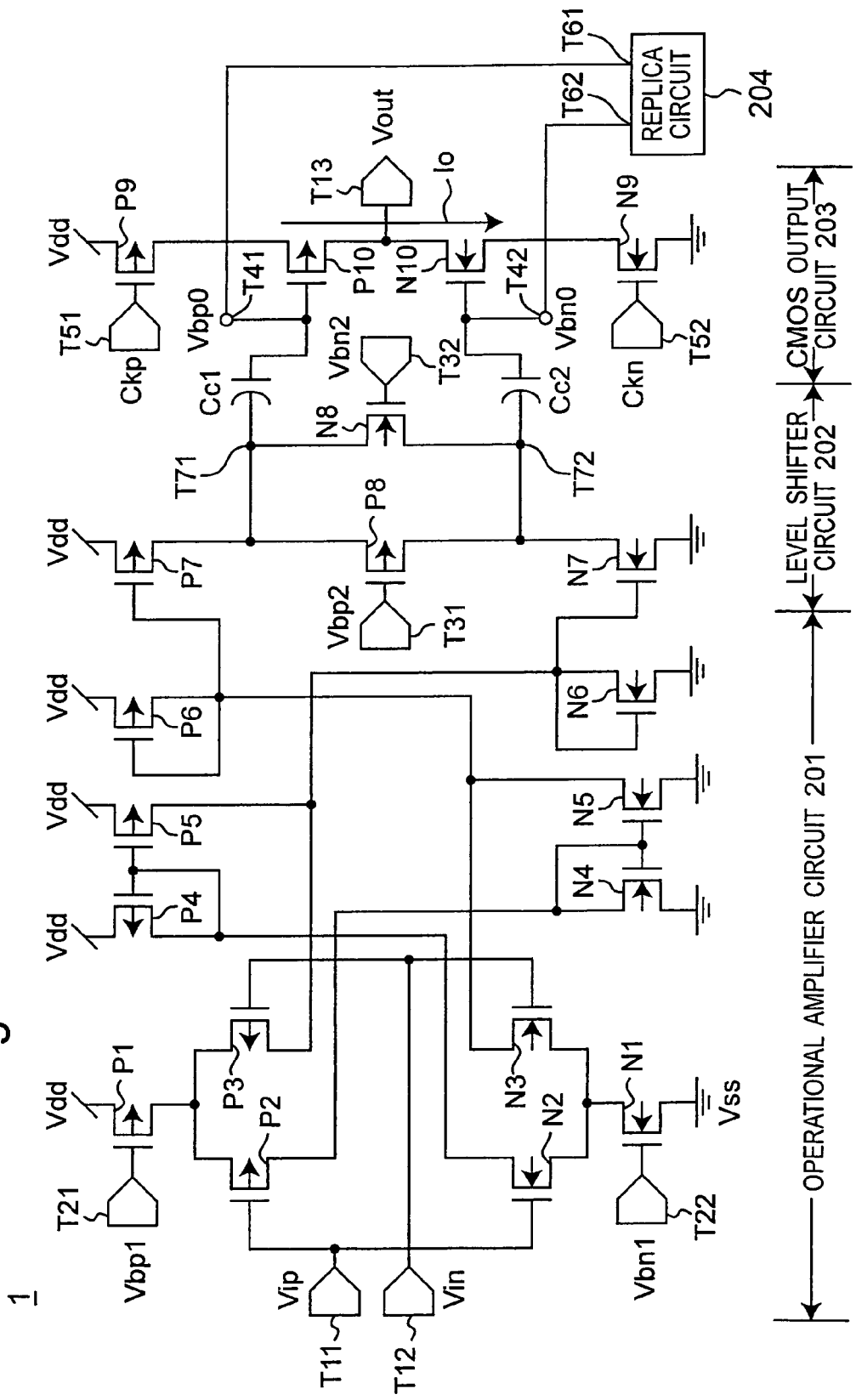
FIG. 2 is a circuit diagram showing a configuration of a switched amplifier 1 shown in FIG. 1.
Figure 3:
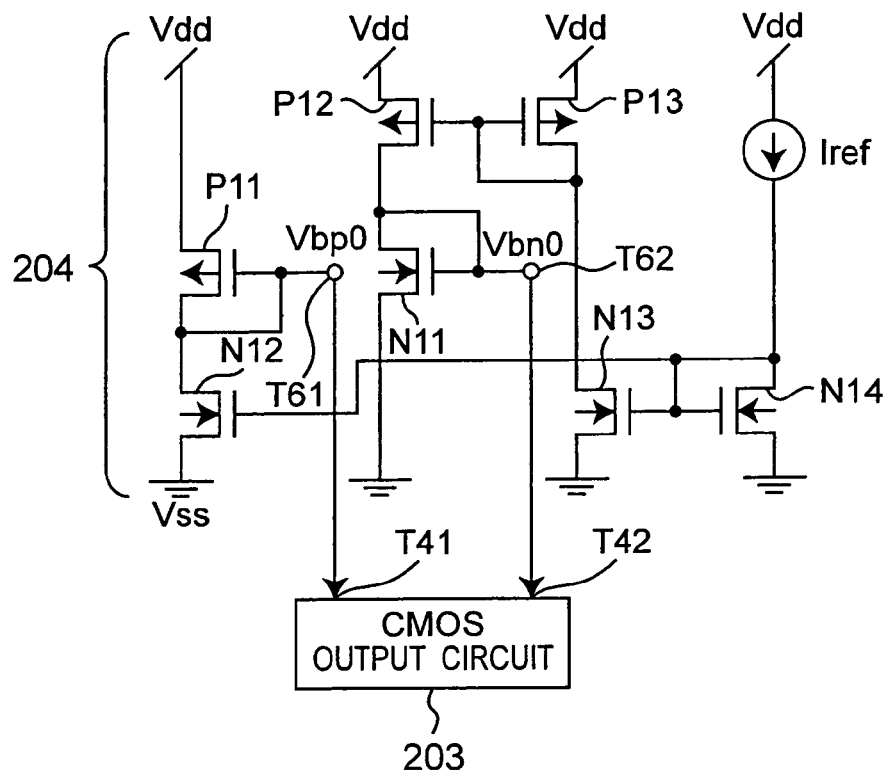
FIG. 3 is a circuit diagram showing a configuration of a replica circuit shown in FIG. 2.
Figure 4:
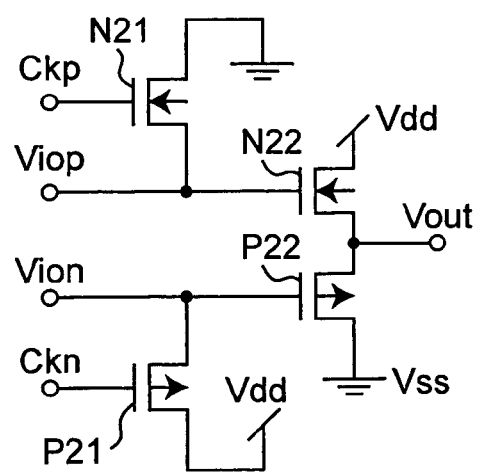
FIG. 4 is a circuit diagram showing a first implemental example 203-A1 of a CMOS output circuit 203 shown in FIG. 2.
Figure 5:
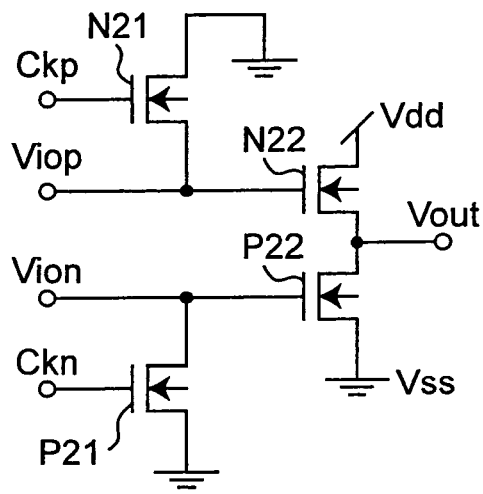
FIG. 5 is a circuit diagram showing a second implemental example 203-A2 of the CMOS output circuit 203 shown in FIG. 2.
Figure 6:
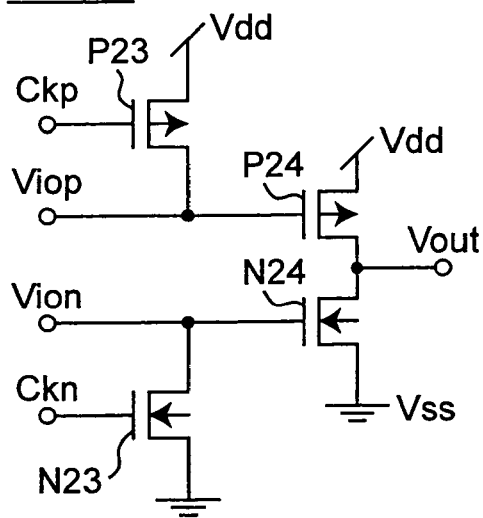
FIG. 6 is a circuit diagram showing a third implemental example 203-A3 of the CMOS output circuit 203 shown in FIG. 2.
Figure 7:
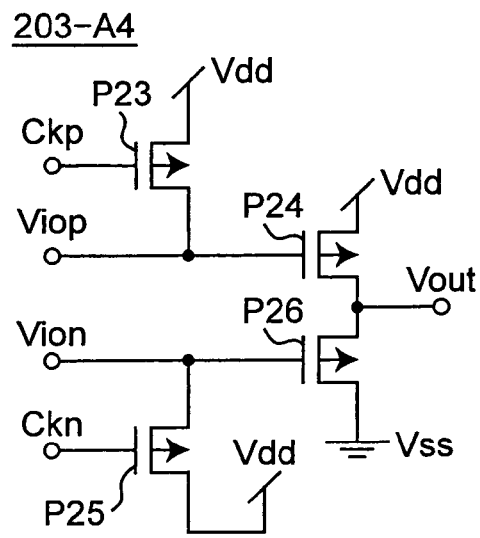
FIG. 7 is a circuit diagram showing a fourth implemental example 203-A4 of the CMOS output circuit 203 shown in FIG. 2.
Figure 8:
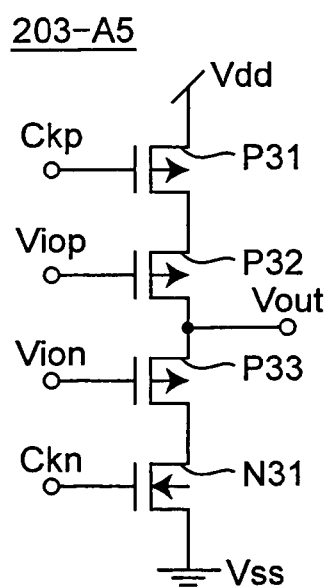
FIG. 8 is a circuit diagram showing a fifth implemental example 203-A5 of the CMOS output circuit 203 shown in FIG. 2.
Figure 9:
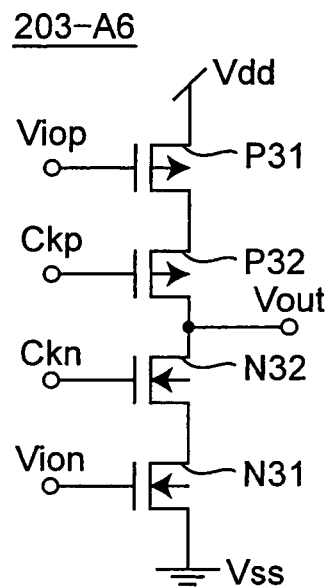
FIG. 9 is a circuit diagram showing a sixth implemental example 203-A6 of the CMOS output circuit 203 shown in FIG. 2.
Figure 10:
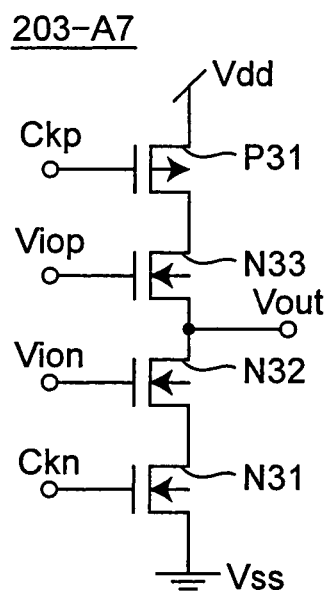
FIG. 10 is a circuit diagram showing a seventh implemental example 203-A7 of the CMOS output circuit 203 shown in FIG. 2.
Figure 11:
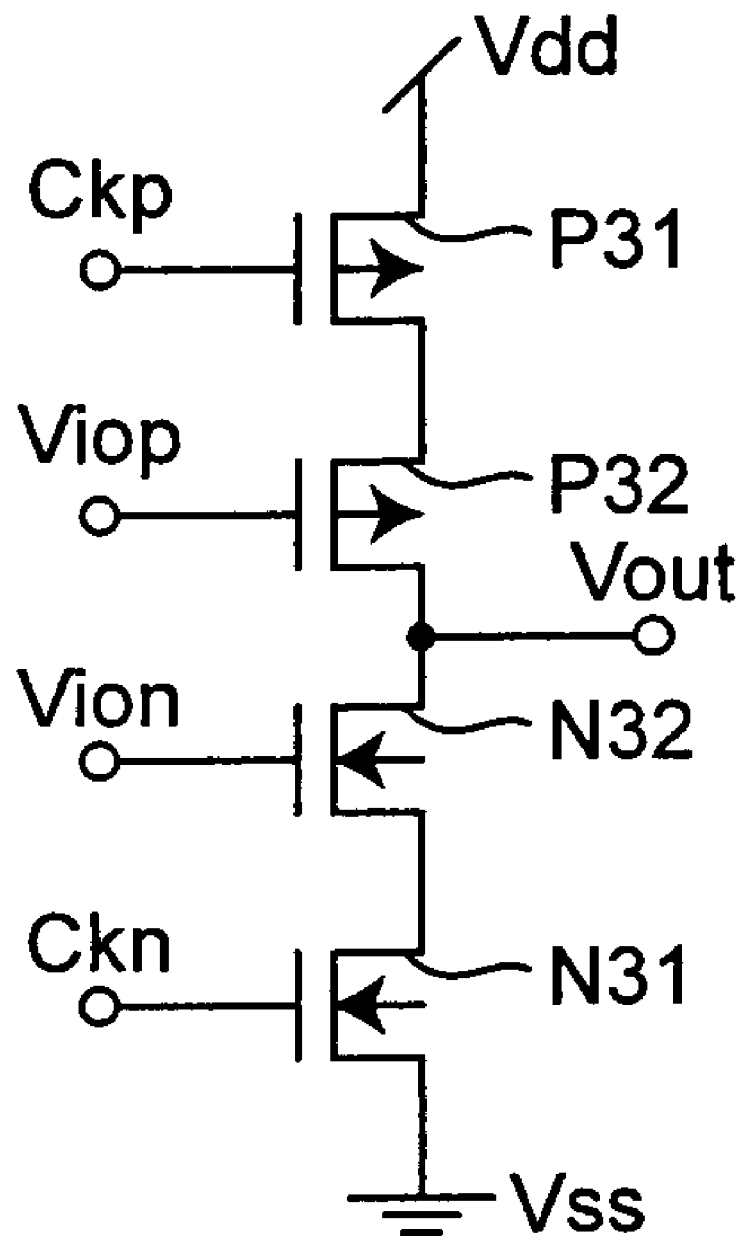
FIG. 11 is a circuit diagram showing an eighth implemental example 203-A8 of the CMOS output circuit 203 shown in FIG. 2.

FIG. 2 is a circuit diagram showing a configuration of the switched amplifier 1 shown in FIG. 1. FIG. 3 is a circuit diagram showing a configuration of a replica circuit shown in FIG. 2. As shown in FIG. 2, the switched amplifier 1 is configured so that an operational amplifier circuit 201, a level shifter circuit 202, a CMOS output circuit 203, and a replica circuit 204 are formed on the same semiconductor substrate, and the switched amplifier 1 is characterized in that bias voltages Vbp0 and Vbn0 of the CMOS output circuit 203 are generated and supplied by the replica circuit 204 including MOSFETs each having a size substantially equal or similar to that of the CMOS output circuit 203.

Referring to FIG. 2, the operational amplifier circuit 201 is a well-known operational amplifier circuit of differential amplification type that includes six P channel MOSFETs P1 to P6 and six N channel MOSFETs N1 to N6, and that has multiple stages thereof. The operational amplifier circuit 201 is formed by CMOS circuits connected between the power supply voltage Vdd and the grounding voltage Vss. Differential input signals Vip and Vin, which are inputted to input terminals T11 and T12 respectively, are amplified by the operational amplifier circuit 201, and they are outputted to the level shifter circuit 202. A bias voltage Vbp1 is applied to a bias input terminal T21 connected to a gate of the P channel MOSFET P1 of the first stage, whereas a bias voltage Vbn1 is applied to a bias input terminal T22 connected to a gate of the N channel MOSFET N1 of the first stage.

The level shifter circuit 202 is configured by including two P channel MOSFETs P7 and P8 and two N channel MOSFETs N7 and N8. The level shifter circuit 202 changes a bias voltage Vbp2 applied to a bias input terminal T31 connected to a gate of a P channel MOSFET P8, and changes a bias voltage Vbn2 applied to a bias input terminal T32 connected to a gate of an N channel MOSFET N8, to shift levels of differential output voltage signals outputted from the operational amplifier circuit 201. Thereafter, the level shifter circuit 202 outputs the level-shifted differential output voltage signals to the CMOS output circuit 203 via coupling capacitors Cc1 and Cc2, each of which is provided for separating the bias voltage between the circuits 202 and 203. In the level shifter circuit 202, the power supply voltage source Vdd is connected to a terminal T71 via a source and a drain of the P channel MOSFET P7, and the terminal T71 is connected to a terminal T72 via a source and a drain of the P channel MOSFET P8. Further, the terminal T72 is grounded via a source and a drain of the N channel MOSFET N7. The terminal T71 is connected to the terminal T72 via a drain and a source of the N channel MOSFET N8.

The CMOS output circuit 203 is configured by including two P channel MOSFETs P9 and P10 and two N channel MOSFETs N9 and N10. The power supply voltage source Vdd is connected to a source of the P channel MOSFET P10 via a source and a drain of the P channel MOSFET P9, and the source of the P channel MOSFET P10 is connected to an output terminal T13 via a drain of the P channel MOSFET P10. The output terminal T13 is connected to a drain of the N channel MOSFET N9 via a drain and a source of the N channel MOSFET N10, and the drain of the N channel MOSFET N10 is grounded via a source thereof. Further, the output terminal of the coupling capacitor Cc1 is connected to a bias input terminal T41 and a gate of the P channel MOSFET P10, and the output terminal of the coupling capacitor Cc2 is connected to a bias input terminal T42 and a gate of the N channel MOSFET N10. A predetermined voltage is applied to the bias input terminals T41 and T42 from the replica circuit 204 as described later in detail.

In the switched amplifier 1 shown in FIG. 2, the bias voltages Vbp1 and Vbn1 are set to bias voltages at which the P channel MOSFET P1 and the N channel MOSFET N1 can operate as current sources. Concretely, the bias voltages Vbp1 and Vbn1 are set as represented by the following Equations (5) and (6):

$$\text{Vthn} < \text{Vbn1} < \text{Vdd} \qquad (5),$$

and $$|\text{Vthp}| > \text{Vbn1} > \text{Vss} \qquad (6).$$

In the Equations (5) and (6), Vdd denotes a voltage of the power supply voltage source, and Vss denotes a grounding voltage. In addition, Vthn denotes a threshold voltage of the N channel MOSFET N1, and Vthp denotes a threshold voltage of the P channel MOSFET P1. Further, the bias voltages Vbp2 and Vbn2 are set so that an operating current $I_o$ flows during an output balanced period when the CMOS output circuit 203 operates as a class AB CMOS output circuit.

In the CMOS output circuit 203 as configured as described above, a switching signal Ckp equal to or higher than the threshold voltage Vthp of the P channel MOSFET P9 is applied to a bias input terminal T51 connected to the gate of the P channel MOSFET P9 to turn off the P channel MOSFET P9, and a switching signal Ckn equal to or lower than the threshold voltage Vthn of the N channel MOSFET N9 is applied to a bias input terminal T52 connected to the gate of the N channel MOSFET N9 to turn off the N channel MOSEFT N9. In this case, the output terminal T13 connected to the drain of the P channel MOSFET P10 and the drain of the N channel MOSFET N10 are set into a high impedance state or a so-called open state. On the other hand, the switching signal Ckp lower than the threshold voltage Vthp of the P channel MOSFET P9 is applied to the bias input terminal T51 to turn on the P channel MOSFET P9, and the switching signal Ckn equal to or higher than the threshold voltage Vthn of the N channel MOSFET N9 is applied to the bias input terminal T52 to turn on the N channel MOSFET N9. In this case, an operating current $I_o$ flows to the P channel MOSFETs P9 and P10 and the N channel MOSFETs N10 and N9 from the power supply voltage source Vdd, and differential input signals inputted via the coupling capacitors Cc1 and Cc2 are outputted from the output terminal T13 via the CMOS output circuit 203.

The replica circuit 204 shown in FIG. 3 is configured by including three P channel MOSFETs P11 to P13, four N channel MOSFETs N11 to N14, and a reference current source Iref. The replica circuit 204 is formed on the same semiconductor substrate as that of the switched amplifier 1 shown in FIG. 2.

Referring to FIG. 3, the power supply voltage source Vdd is connected to a drain of the N channel MOSFET N12 via a source and a drain of the P channel MOSFET P11, and a source of the N channel MOSFET N12 is grounded. The drain of the P channel MOSFET P11 is connected to a gate thereof, and is also connected to a bias output terminal T61 connected to the bias input terminal T41 of the CMOS output circuit 203. A gate of the N channel MOSFET N12 is connected to not only a gate and a drain of the N channel MOSFET N14, but also a gate of the N channel MOSFET N13.

Further, the power supply voltage Vdd is connected to a drain and the gate of the N channel MOSFET N12 via the source and the drain of the P channel MOSFET P12, and is also connected to a bias output terminal T62 connected to the bias input terminal T42 of the CMOS output terminal 203. The source of the N channel MOSFET N12 is grounded. A gate of the P channel MOSFET P12 is connected to a gate and a drain of the P channel MOSFET P13, and is grounded via a drain and a source of the N channel MOSFET N13. The power supply voltage source Vdd is grounded via the reference current source Iref and the drain and the source of the N channel MOSFET N14.

In the replica circuit 204 shown in FIG. 3, the P channel MOSFET P11 and the N channel MOSFET N12 are formed on the same semiconductor substrate so as to have substantially equal sizes or similar or analogous sizes (where the size mean a size including a gate length and a gate width, and an analogous size mean that a ratio of the gate length to the gate width is substantially equal to each other. This is applied to below) to those of the P channel MOSFET P10 and the N channel MOSFET N10 shown in FIG. 2, respectively. In addition, the P channel MOSFET P12 and the N channel MOSFET N11 are formed on the same semiconductor substrate so as to have substantially equal sizes or similar or analogous sizes to those of the P channel MOSFET P10 and the N channel MOSFET N10 shown in FIG. 1, respectively.

In the replica circuit 204 as configured as described above, when the reference current Iref corresponding to the operating current $I_o$ shown in FIG. 2 is made to flow therein, a bias voltage Vbp0 applied to the gate of the P channel MOSFET P11 and a bias voltage Vbn0 applied to the N channel MOSFET N11 are determined so as to correspond to the reference current Iref. By applying the bias voltages Vbp0 and Vbn0 to the gate of the P channel MOSFET P10 and the gate of the N channel MOSFET N10, respectively, to be used as the bias voltages shown in FIG. 1, the operating current $I_o$ can be set so as to correspond to the reference current Iref.

As described above, the class AB CMOS output circuit 203 that supplies the bias voltages of the CMOS output circuit 203 shown in FIG. 2 can be configured by the replica circuit 204. Even a low voltage circuit which cannot realize a bias circuit by providing multiple-stage transistors has such unique actions and advantageous effects that the class AB CMOS output circuit 203 can be realized. In other words, the class AB CMOS output circuit 203 according to the present preferred embodiment operates at the power supply voltage equal to or lower than 1 V, and a stationary current of the class AB output circuit 203 can be arbitrarily set from an outside circuit or unit. The input circuit of the switched amplifier 1 shown in FIG. 2 is configured of differential input type. However, the present invention is not limited to this, and the input circuit may be configured of one input type shown in FIG. 1.

FIGS. 4 to 11 are circuit diagrams showing a first implemental example 203A1 to an eighth implemental example 203A8 of the CMOS output circuit 203 shown in FIG. 2, respectively. As shown in FIGS. 4 to 11, the CMOS output circuit 203 may be configured by a complementary source-grounded amplifier or a complementary source follower amplifier including N channel MOSFETs and P channel MOSFETs. In this case, in order to implement the switching operation, as shown in FIGS. 4 to 7, such a circuit configuration can be used as in which grounded switches (grounded MOSFET switches) or MOSFET switches connected to the power supply voltage source Vdd are connected to gates of the N channel MOSFETs and the P channel MOSFETs that constitute the amplifier, and the output terminal thereof is biased to a cutoff region so to set the output terminal thereof into a high impedance state. Alternatively, as shown in FIGS. 8 to 11, such a circuit configuration can be used as in which grounded switches (grounded MOSFET switches) or MOSFET switches connected to the power supply voltage source Vdd are connected in series between the ground potential and the power supply voltage source Vdd of the N channel MOSFETs and the P channel MOSFETs that constitute the amplifier, and the output terminal thereof is biased to a cutoff region so as to set the output terminal thereof into a high impedance state.

The switched amplifier 1 may have any circuit configuration other than the circuit configuration shown in FIG. 2 as long as the circuit configuration is such that the signal transmission from the input terminal to the output terminal can be cut off and that the output terminal can be set into a floating state that is the high impedance state.

The output terminal of the switched amplifier 1 shown in FIG. 1 is connected to one end of the hold capacitor 7. When the output terminal of the switched amplifier 1 is in the high impedance state, one end of the hold capacitor 7 is connected to the reference voltage source Vrefn via the switch 8 and the terminal 6. In FIG. 1, the switch 8 that connects the hold capacitor 7 to the reference voltage source Vrefn is employed. In that case, if the switched amplifier 1 has such a function as connection of the output voltage to the reference voltage source Vrefn, the switch 8 may not be employed.

Figure 12:
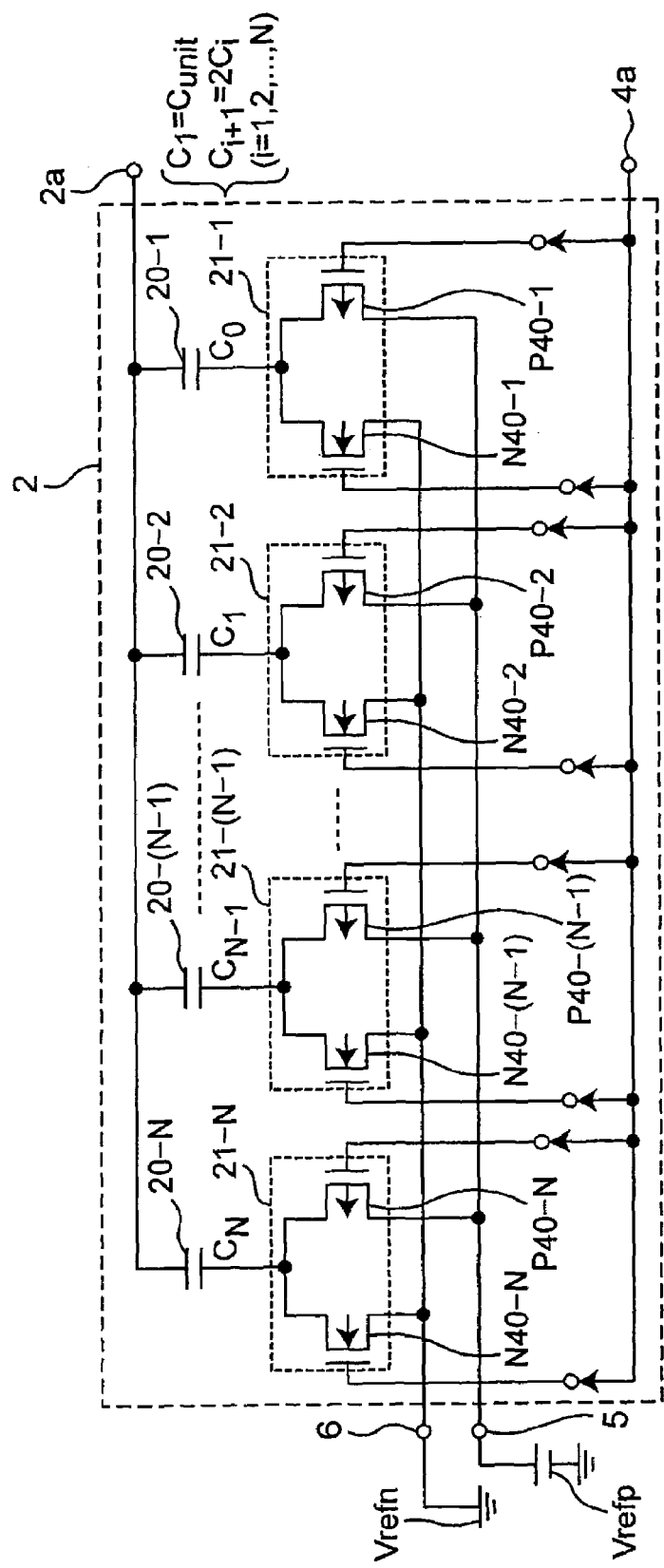
FIG. 12 is a circuit diagram showing a configuration of a DA converter 2 shown in FIG. 1.

FIG. 12 is a circuit diagram showing a configuration of the DA converter 2 shown in FIG. 1. In the DA converter 2 shown in FIG. 12, respective switches (which are circuits on the contact "b" side of the switches 21-1 to 21-N shown in FIG. 1) connected to the reference voltage source Vrefp are configured by P channel MOSFETs P40-1 to P40-N, respectively. In addition, a voltage of the reference voltage source Vrefp is set to one voltage in a range from the power supply voltage source Vdd to a voltage at which the P channel MOSFETs P40-1 to P40-N are normally turned on and off, that is, one voltage in a range from the power supply voltage Vdd to a threshold voltage |Vthp|. Further, respective switches (which are circuits on the contact "a" side of the switches 21-1 to 21-N shown in FIG. 1) connected to the reference voltage source Vrefn are configured by N channel MOSFETs N40-1 to N40-N, respectively. In addition, a voltage of the reference voltage source Vrefn is set to one voltage in a range from the ground potential to a voltage at which the N channel MOSFETs N40-1 to N40-N operate, that is, one voltage in a range from the ground potential to the threshold voltage Vthn.

Figure 13:
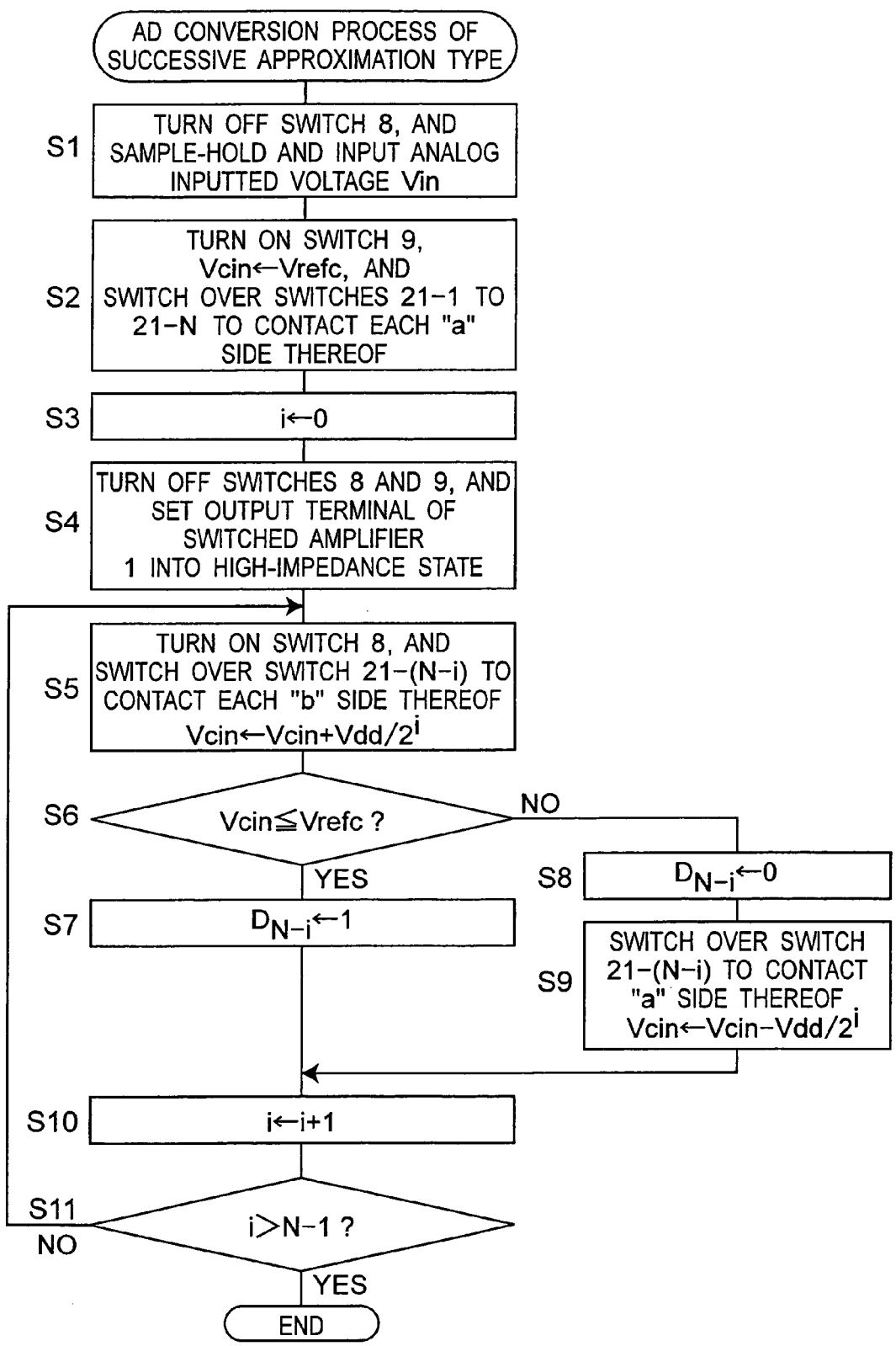
FIG. 13 is a flowchart showing a successive approximation AD conversion process executed by the AD converter circuit shown in FIG. 1.
Figure 14:
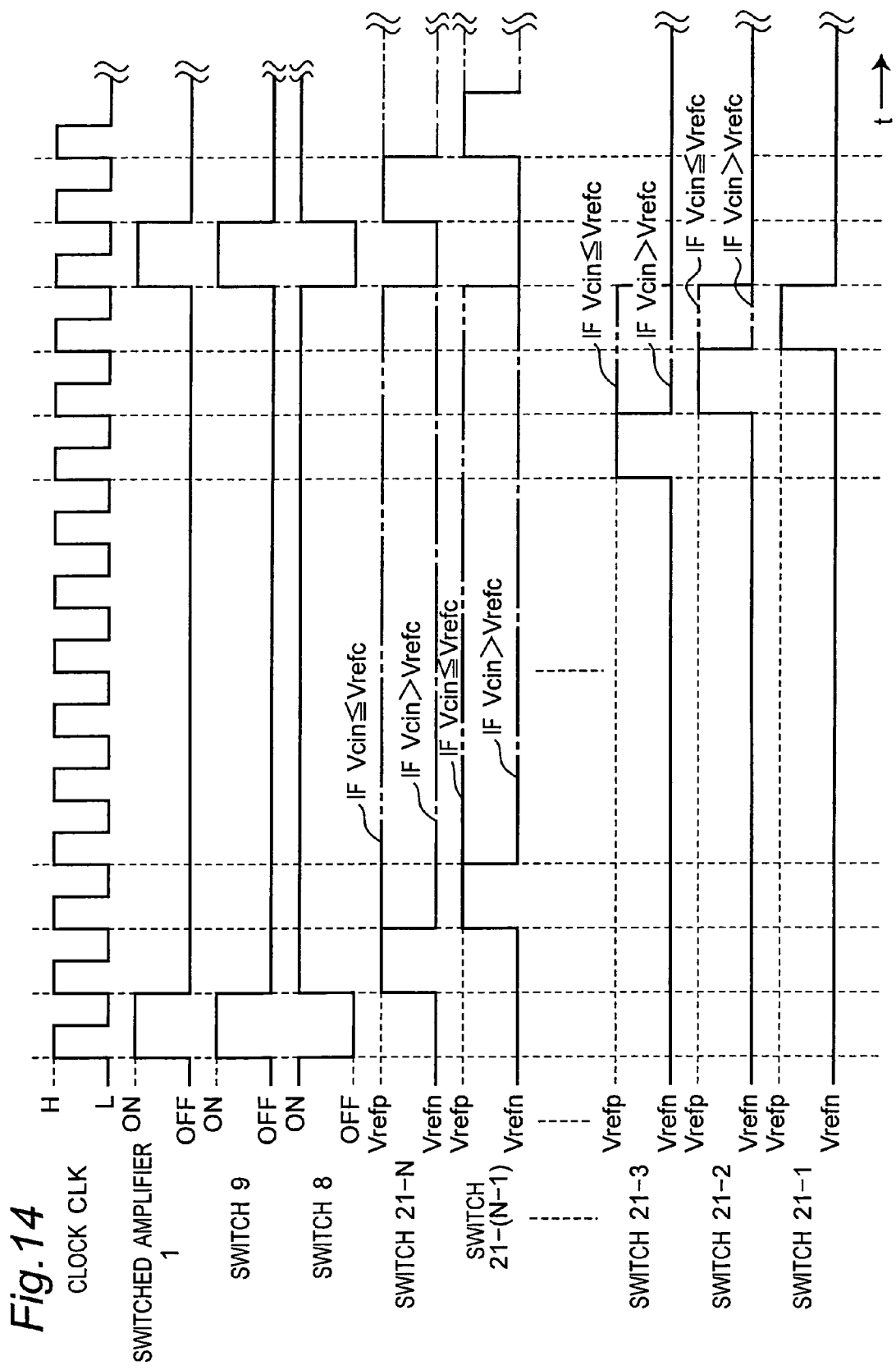
FIG. 14 is a timing chart showing an operation of the successive approximation AD conversion process executed by the AD converter circuit shown in FIG. 1.

FIG. 13 is a flowchart showing an AD conversion process of successive approximation type executed by the AD converter circuit shown in FIG. 1. FIG. 14 is a timing chart showing an operation of the AD conversion process of successive approximation type executed by the AD converter circuit shown in FIG. 1. The circuit operation of the AD converter circuit shown in FIG. 1 will be described in detail with reference to FIGS. 13 and 14.

Referring to FIG. 13, at step S1, the switch 8 is turned off, and an input analog signal Vin is sample-held by the sample hold circuit 7A and then, a sample-held signal is applied to the hold capacitor 7. At the same time, at step S2, the switch 9 is turned on, and an output voltage Vcin (2a) of the DA converter 2 is set to the intermediate reference voltage Vrefc. At that time, a relationship of Vthna<Vrefc<Vdd−Vthpa is held. Further, all of the switches 21-1 to 21-N of the DA converter 2 are all switched over to the contact "a" side thereof, and lower one end of each of the capacitors 20-1 to 20-N is grounded. Next, in order for the comparison operation of the AD converter circuit, a count parameter "i" is reset to zero at step S3. Thereafter, at step S4, the switches 8 and 9 are both turned off and the output terminal of the switched amplifier 1 is set into the floating state (high impedance state), so as to hold the sampled signals in the hold capacitor 7.

At step S5, the switch 8 is turned on, and is grounded to determine the most significant bit $D_N$ (MSB) of the output signal from the successive approximation register 4. At the same time, the switch 21-N is switched over to the contact "b" side thereof, and the lower end of the capacitor 20-N is connected to the power supply voltage source Vdd. If the output voltage of the sample hold circuit 7A is Vin, the output voltage Vcin of the DA converter 2 is represented by the following Equation (7):

$$Vcin=Vrefc-Vin\times(C_N/C_{total})+Vdd\times(C_{N-1}/C_{total}) \quad (7).$$

In the Equation (7), $C_{total}$ is represented by the following Equation (8):

$$C_{total}=C_N+C_{N-1}+\ldots+C_o \quad (8).$$

In the Equations (7) and (8), $C_{total}$ denotes a sum of all capacities of the capacitor array of the DA converter 2. Through the process at step S5, the output voltage Vcin of the DA converter 2 is changed to a voltage of $Vcin+Vdd/2^i$.

At step S6, the comparator 3 compares the intermediate reference voltage Vrefc with the output voltage Vcin from the DA converter 2. If the output voltage Vcin is equal to or lower than the intermediate reference voltage Vrefc ("YES" at step S6), then the comparator 3 outputs a low-level comparison result signal, and the output signal $D_{N-i}$ from the successive approximation register 4 becomes "1" of a digital value (step S7), and the process flow goes to step S10. If "NO" at step S6, then the comparator 3 outputs a high-level comparison result signal, and the output signal $D_{N-i}$ from the successive approximation register 4 is a digital value "0" at step S8. At step S9, the switch 21-(N−i) is switched over to the contact "a" side thereof (in this case, the output voltage Vcin from the DA converter 2 is set to $Vin-Vdd/2^i$), and the process flow goes to step S10. At step S10, the count parameter "i" is incremented by one. At step S11, it is judged whether or not the count parameter "i" is larger than N−1. If "NO" at step S11, the process flow returns to step S5, and the above-stated process is repeated. If "YES" at step S11, all the output bit values are established, and then, the conversion process is completed. In the process flow shown in FIG. 13, the same operation is performed from the most significant bit MSB to a least significant bit LSB, and then, this leads to obtaining of the digital signals $D_N$ to $D_1$ of all the bits.

In the AD converter circuit as configured as described above, it suffices that the comparator 3 compares a potential difference between the sample-held input signal Vin and the output voltage Vcin from the DA converter 2, with the appropriately set reference voltage Vrefc. Therefore, the comparator 3 can be realized by a comparator that operates in a narrow voltage range near the intermediate reference voltage Vrefc. Further, an offset compensation method is used for the AD converter circuit of capacitor array type using a negative feedback amplifier as the comparator 3. The comparator 3 has such a disadvantage that an operating rate of the comparator 3 is relatively low, and a power supply current flows during the offset compensation. The AD converter circuit proposed in the present preferred embodiment does not require any feedback, so that the disadvantage can be solved.

Furthermore, even if an offset voltage of the comparator 3 is present, only the judgment point may be shifted by the offset voltage, and the conversion accuracy is not influenced by the offset voltage. When a voltage lower than the ground potential is inputted thereto, the output voltage Vcin from the DA converter 2 exceeds the intermediate reference voltage Vrefc even if the capacitor array switches 21-1 to 21-N of the DA converter 2 are all switched over to the contact "a" sides thereof, respectively, so as to be connected to the grounded potential. Accordingly, all of the digital output signals $D_1$ to $D_N$ from the successive approximation register 4 become "0". In a manner similar to that of above, when a voltage higher than the voltage of the power supply voltage source Vdd is inputted thereto, the output voltage Vcin from the DA converter 2 does not exceed the intermediate reference voltage Vrefc even if the capacitor array switches 21-1 to 21-N of the DA converter 2 are all switched over to the contact "b" sides thereof. Accordingly, all of the digital output signals $D_1$ to $D_N$ from the successive approximation register 4 become "1". Therefore, the grounding voltage and the voltage of the power supply voltage source Vdd define the maximum input voltage and the minimum input voltage to the AD converter circuit, respectively. In addition, a parasitic capacitor is present on an upper common electrode of the capacitor array. However, since the comparator 3 performs the comparison operation at a voltage near the intermediate reference voltage Vrefc, the conversion accuracy does not deteriorate due to this parasitic capacitor as seen in the conventional AD conversion circuit of capacitor array type.

As described above, in the AD converter circuit according to the present preferred embodiment, the voltage range of the input analog signal can be enlarged to the range from the ground potential to the voltage of the power supply voltage source Vdd, and the comparator 3 can be configured by the comparator having a narrow common-mode input voltage range. Therefore, the AD converter circuit can perform the higher-accuracy conversion without any influence of the parasitic capacitor of the capacitor array. This advantageous effect is common to the subsequent preferred embodiments.

In the present preferred embodiment, the control logic circuit 11 and the successive approximation register 4 are configured by separate circuits, respectively. However, the present invention is not limited to this, and the control circuit and the successive approximation register 4 may be configured by one controller such as a digital calculator or a controller having a memory.

Second Preferred Embodiment

Figure 15:
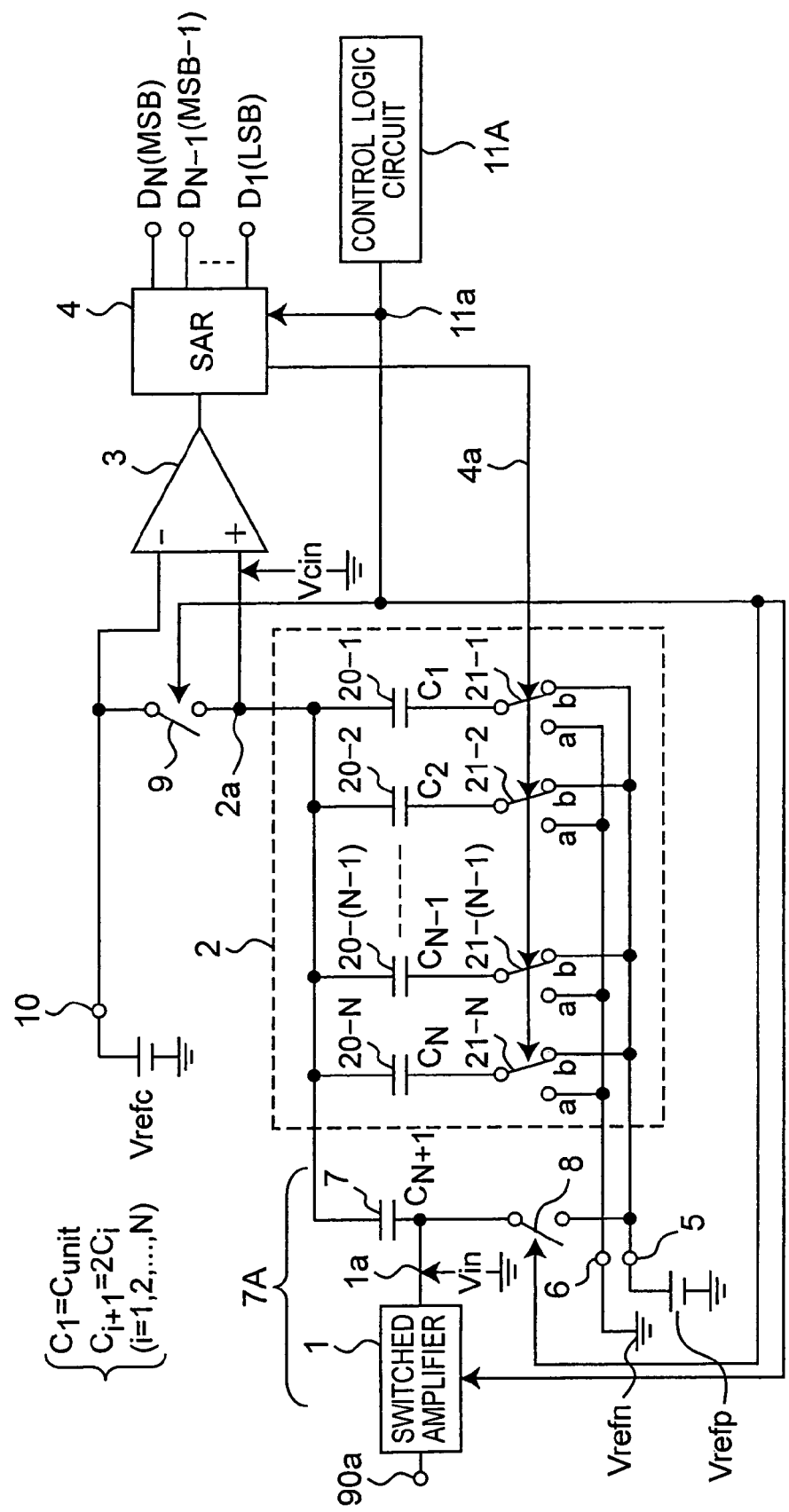
FIG. 15 is a circuit diagram showing a configuration of an AD converter circuit according to a second preferred embodiment of the present invention.

FIG. 15 is a circuit diagram showing a configuration of an AD converter circuit according to a second preferred embodiment of the present invention. The AD converter circuit according to the second preferred embodiment is characterized, as compared with that according to the first preferred embodiment, in that a voltage polarity of each of the capacitors 20-1 to 20-N is inverted, one end of the hold capacitor 7 is connected to the terminal 5 via the switch 8, and in that during sampling and holding, after lower one end of each of the capacitors 20-1 to 20-N is connected to the reference voltage source Vrefp, a successive approximation process of a control logic circuit 11A is performed as described below in detail by increasing voltages of sampled values, then successively reducing the voltages, and then making a comparison during successive approximation.

In an AD converter circuit of successive approximation type shown in FIG. 15, an input analog signal is sampled by a sample hold circuit 7A, and an output voltage Vin of the sampled value is outputted to the hold capacitor 7. At the same time, the switch 9 is turned on, and the output voltage Vcin from the DA converter 2 is set to an appropriately set intermediate reference voltage Vrefc as described above. The capacitors 20-1 to 20-N of the DA converter 2 are connected to the reference voltage source Vrefp via the switches 21-1 to 21-N, respectively. Next, in the AD converter circuit, in order to perform the comparison process, the switch 9 is turned off, an output voltage 1a from the switched amplifier 1 is set into a floating state, and the sampled voltage is held by the hold capacitor 7. Then, in order to determine the most significant bit $D_N$ (MSB) in the successive approximation register 4, the switch 8 is turned on and connected to the intermediate reference voltage Vrefc. At the same time, the switch 21-N is switched over to a contact "a" side thereof, and the terminal 6 is connected to the ground potential Vrefn. In this case, the output voltage from the DA converter 2 is defined as a voltage Vcin, and the output voltage 1a from the switched amplifier 1 is defined as a voltage Vin, then the voltage Vin is represented by the following Equation (9):

$$Vcin=Vrefc+Vin\times(C_{N+1}/(C_{N+1}+C_{total}))-Vrefp\times(C_N/(C_{N+1}+C_{total})) \quad (9).$$

The comparator 3 compares the intermediate reference voltage Vrefc with the output voltage Vcin from the DA converter 2. If the output voltage Vcin is higher than the intermediate reference voltage Vrefc, the comparator 3 outputs a low-level comparison result signal. Then, the digital signal $D_N$ that is the most significant bit MSB of the successive approximation register 4 becomes "0", and the switch 21-N is kept so as to be switched over to the contact "a" side thereof, that is, kept so as to be connected to the ground potential Vrefn. On the other hand, if the output voltage Vcin is equal to or lower than the intermediate reference voltage Vrefc, the comparator 3 outputs a high-level comparison result signal. Then, the digital signal $D_N$ that is the most significant bit MSB of the successive approximation register 4 becomes a digital value "1", and the switch 21-N is switched over from the contact "a" side thereof to a contact "b" side thereof, that is, they are switched over thereto so as to be connected to the reference voltage source Vrefp. The subsequent operation is performed in a manner similar to that of the AD converter circuit shown in FIG. 1, and the digital value of the least significant bit is obtained.

As described above, the AD converter circuit according to the present preferred embodiment exhibits the same advantageous effects as those of the AD converter circuit according to the first preferred embodiment. Namely, the input analog signal voltage range can be enlarged to a range from the ground potential to the voltage of the power supply voltage source Vdd, and the comparator 3 can be configured by a comparator having a narrow common-mode input voltage range. The AD converter circuit can perform the accurate conversion without any influence of the offset voltage of the comparator 3 and without any influence of the parasitic capacitor of the capacitor array.

Third Preferred Embodiment

Figure 16:
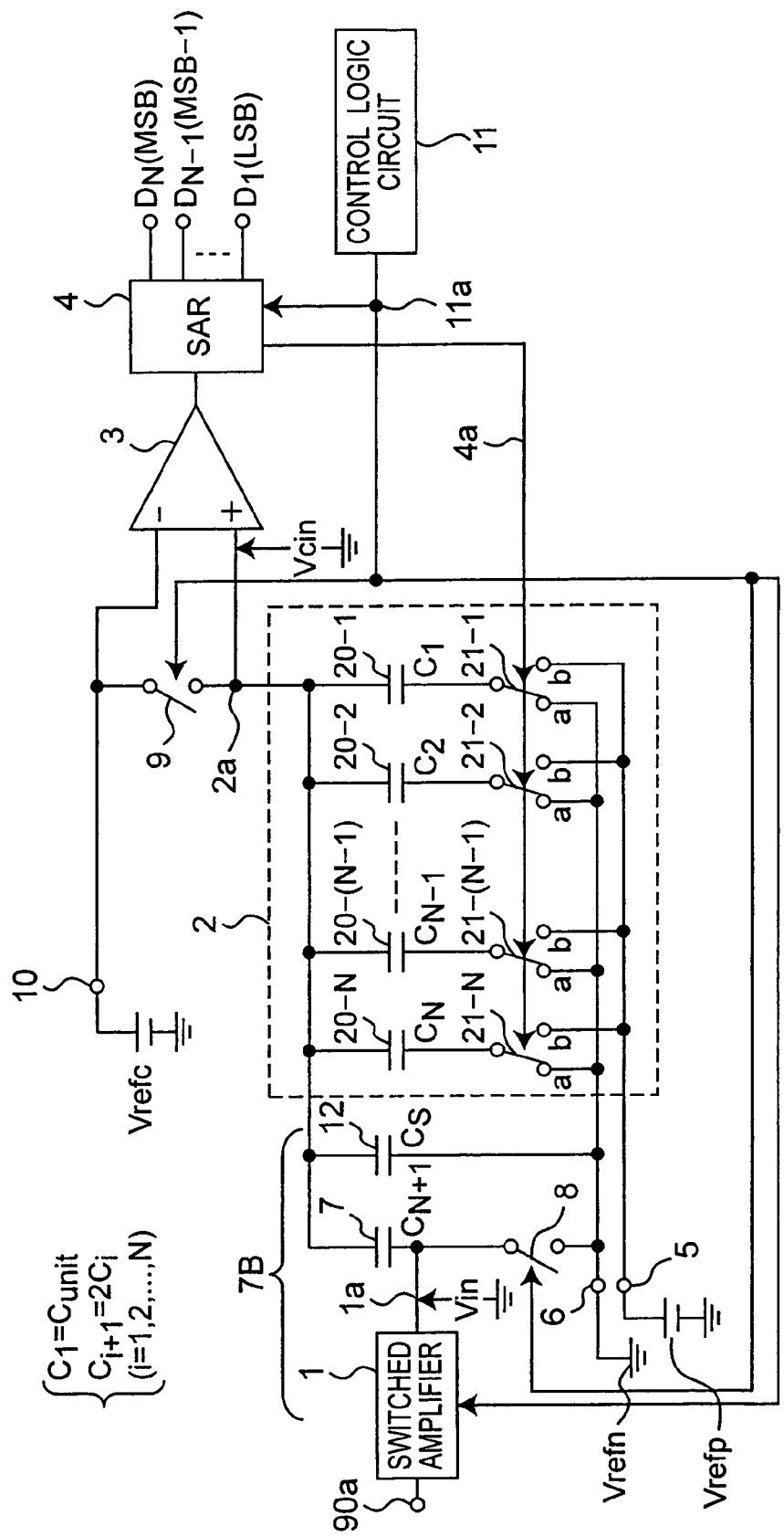
FIG. 16 is a circuit diagram showing a configuration of an AD converter circuit according to a third preferred embodiment of the present invention.

FIG. 16 is a circuit diagram showing a configuration of an AD converter circuit according to a third preferred embodiment of the present invention. The AD converter circuit according to the third preferred embodiment is characterized, as compared with that according to the first preferred embodiment shown in FIG. 1, by further including an additional capacitor 12 having a capacitance Cs between a connection line of an output voltage 2a from the DA converter 2 and the terminal 5. In the AD converter circuit according to the third preferred embodiment as configured as described above, the additional hold capacitor 12 can control the maximum amplitude of the output voltage Vcin from the DA converter 2. If the additional hold capacitor 12 is not provided (in case of FIG. 1), and the output voltage from the DA converter 2 is defined as a voltage Vcin and that the output voltage of the switched amplifier 1 is defined as a voltage Vin, then the output voltage Vin is represented by the following Equation (10):

$$Vcin=Vrefc-Vin\times(C_{N+1}/(C_{N+1}+C_{total})) \quad (10).$$

If the voltage Vrefc is 0.3 V and the voltage Vin is 0.9 V, for example, the voltage Vcin of −0.15 V is applied to the non-inverting input terminal of the comparator 3. When the voltage Vcin is applied to the comparator 3 and a switch 9, leakage of stored electric charges may possibly occur although a device reliability does not deteriorate.

If the additional hold capacitor 12 is added to the AD converter circuit shown in FIG. 1 (in case of FIG. 16), the output voltage Vcin from the DA converter 2 is represented by the following Equation (11):

$$Vcin = Vrefc - Vin \times (C_{N+1}/(CS+C_{N+1}+C_{total})) \quad (11).$$

If the capacitance Cs is equal to the capacitance $C_{N+1}$, the voltage Vref is 0.3 V, and the voltage Vin is 0.9 V, for example, the output voltage Vcin becomes 0 V. Accordingly, the comparator 3 and the switch 9 as configured by, for example, an N channel MOSFET are not set into inverse bias states, and therefore, any unexpected leakage of the electric charge does not occur.

As described above, the AD converter circuit according to the present preferred embodiment exhibits the actions and advantageous effects as those of the AD converter circuit according to the first preferred embodiment, and exhibits such a unique advantageous effect that any unexpected leakage of the electric charge does not occur.

Fourth Preferred Embodiment

Figure 17:
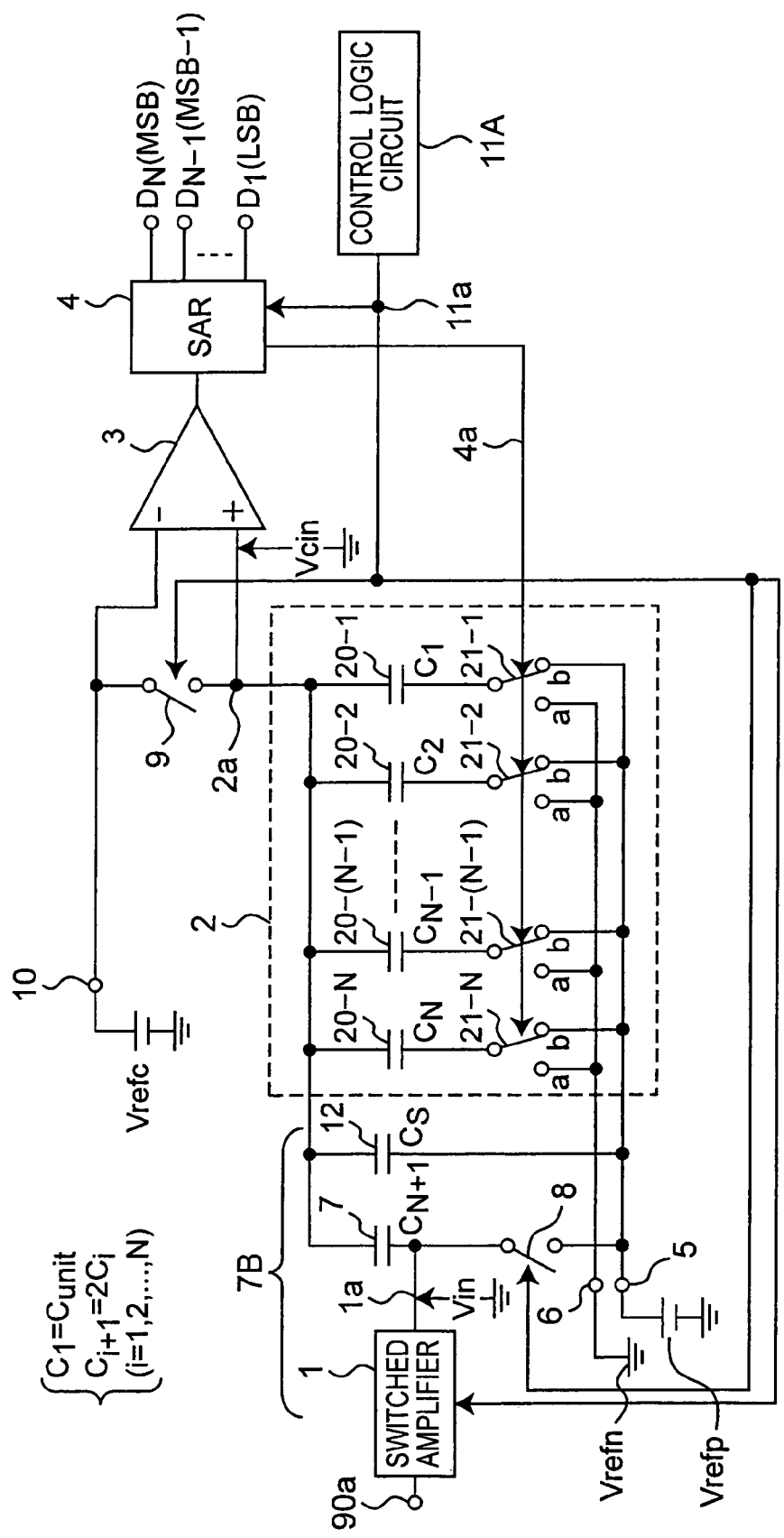
FIG. 17 is a circuit diagram showing a configuration of an AD converter circuit according to a fourth preferred embodiment of the present invention.

FIG. 17 is a circuit diagram showing a configuration of an AD converter circuit according to a fourth preferred embodiment of the present invention. The AD converter circuit according to the fourth preferred embodiment is characterized, as compared with that according to the second preferred embodiment shown in FIG. 15, by further including an additional capacitor 12 having a capacitance Cs between a connection line of an output voltage 2a from a DA converter 2 and a terminal 5. In the AD converter circuit according to the fourth preferred embodiment as configured as described above, the additional hold capacitor 12 can control the maximum amplitude of an output voltage Vcin from the DA converter 2. Therefore, the AD converter circuit according to the present preferred embodiment exhibits the same actions and advantageous effects as those of the AD converter circuit according to the second preferred embodiment, and exhibits such a unique advantageous effect that any unexpected leakage of the electric charge does not occur.

Fifth Preferred Embodiment

Figure 18:
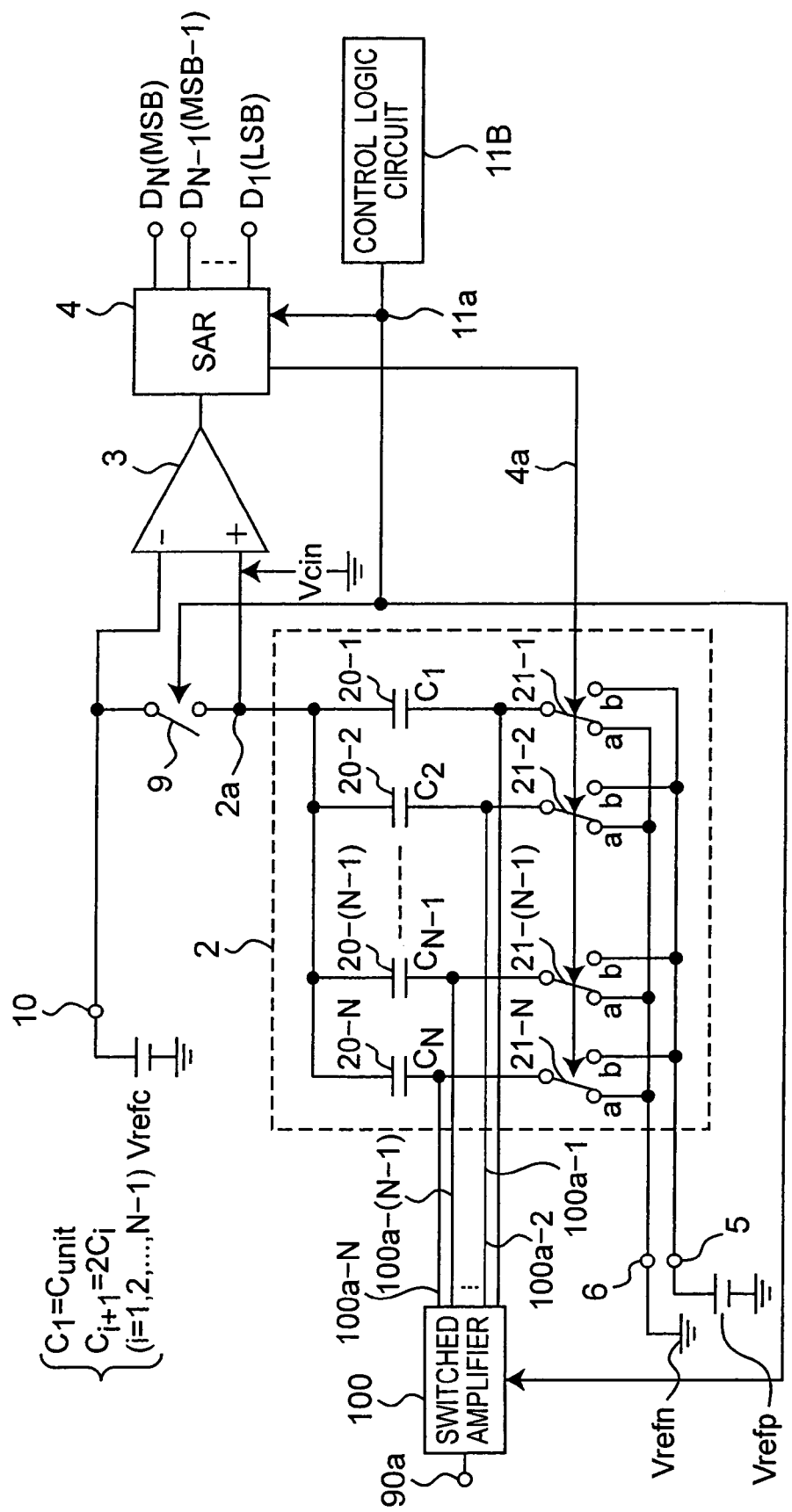
FIG. 18 is a circuit diagram showing a configuration of an AD converter circuit according to a fifth preferred embodiment of the present invention.
Figure 19:
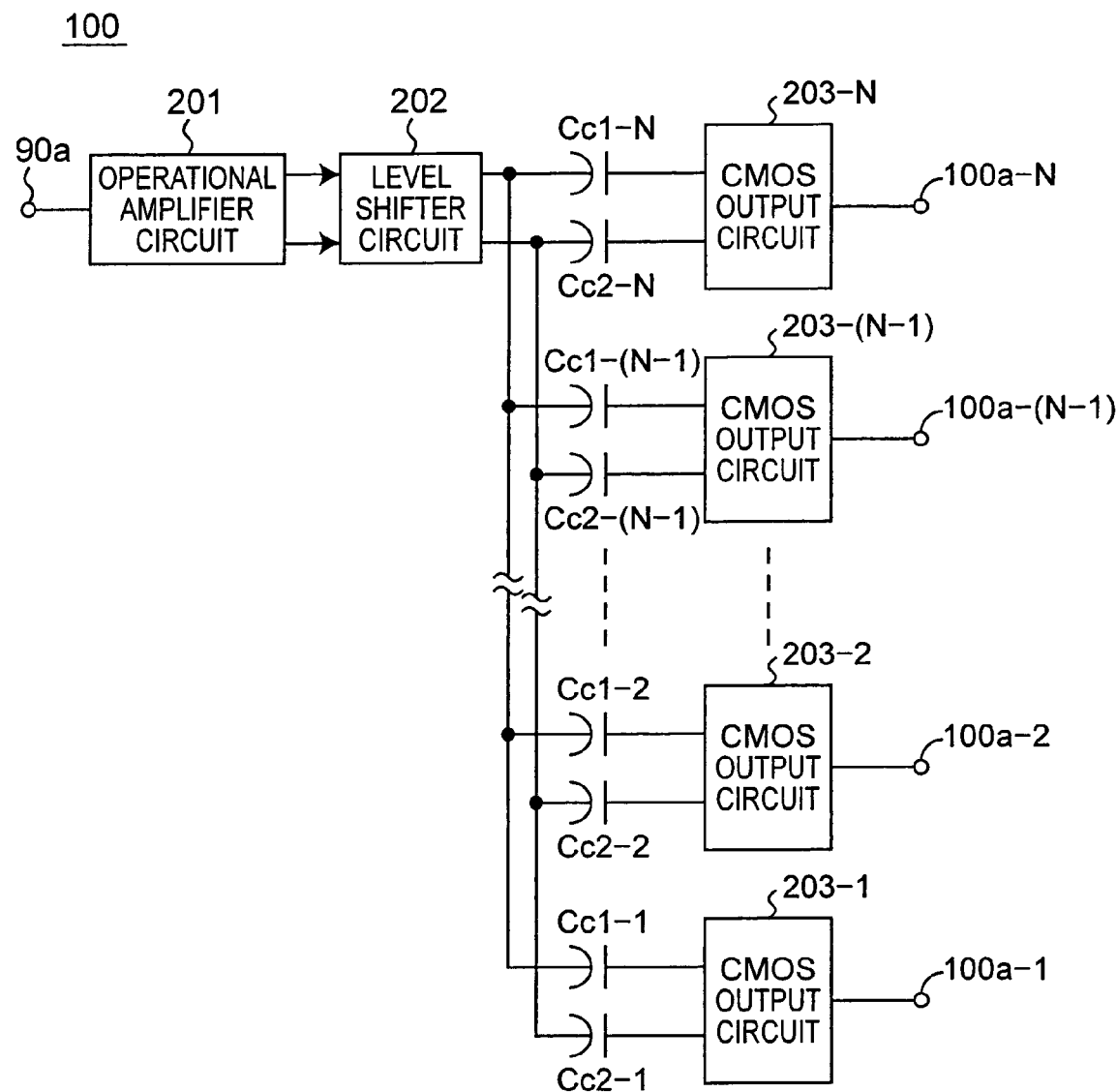
FIG. 19 is a block diagram showing a configuration of a switched amplifier 100 shown in FIG. 18.

FIG. 18 is a circuit diagram showing a configuration of an AD converter circuit according to a fifth preferred embodiment of the present invention. FIG. 19 is a block diagram showing a configuration of a switched amplifier 100 shown in FIG. 18. The AD converter circuit according to the fifth preferred embodiment is characterized, as compared with the AD converter circuit according to the first preferred embodiment shown in FIG. 1, by including N CMOS output circuits 203-1 to 203-N as shown in FIG. 19, and by executing a sample hold and a DA conversion using capacitors 20-1 to 20-N of a DA converter 2 of capacitor array type as hold capacitors based on the output voltages 100a-1 to 100a-N from these N CMOS output circuits 203-1 to 203-N.

A switched amplifier 100 shown in FIG. 19 is configured to include an operational amplifier circuit 201, a level shifter circuit 202, and the N CMOS output circuits 203-1 to 203-N of the same number N as that of the N switches 21-1 to 21-N. The two differential output signals from the level shifter circuit 202 are outputted to the CMOS output circuit 203-1 via two coupling capacitors Cc1-1 and Cc2-1, are outputted to the CMOS output circuit 203-2 via two coupling capacitors Cc1-2 and Cc2-2, . . . , and are outputted to the CMOS output circuit 203-N via two coupling capacitors CcN-1 and CcN-1. Further, the output voltages 100a-1 to 100a-N are outputted from the CMOS output circuits 203-1 to 203-N, and are applied to lower ends of the capacitors 20-1 to 20-N of the DA converter 2 shown in FIG. 18, respectively.

In the AD converter circuit as configured as described above as shown in FIG. 18, during sampling, an input voltage is applied to the lower ends of the respective capacitors 20-1 to 20-N of the capacitor array via the switched amplifier 100, and then, they are sampled. The other configurations and operation are the same as those of the circuit shown in FIG. 1. According to the present preferred embodiment, the hold capacitor 7 is unnecessary so that a chip area of the AD converter circuit is advantageously reduced. However, the N CMOS output circuits 203 are necessary in the switched amplifier 100, and this leads to increase in the chip area of the switched amplifier 100, and increases in the consumption power. In addition, the deviations of the characteristics among the respective CMOS output circuits 203-1 to 203-N influence the conversion accuracy. According to the present preferred embodiment, there are provided the N CMOS output circuits 203-1 to 203-N of the switched amplifiers 100 of the same number N as that of the switches 20-1 to 20-N of the capacitor array. However, the preset invention is not limited to this, and there may be realized N switched amplifiers 100 of the same number N as that of the switches 20-1 to 20-N of the capacitor array.

Sixth Preferred Embodiment

Figure 20:
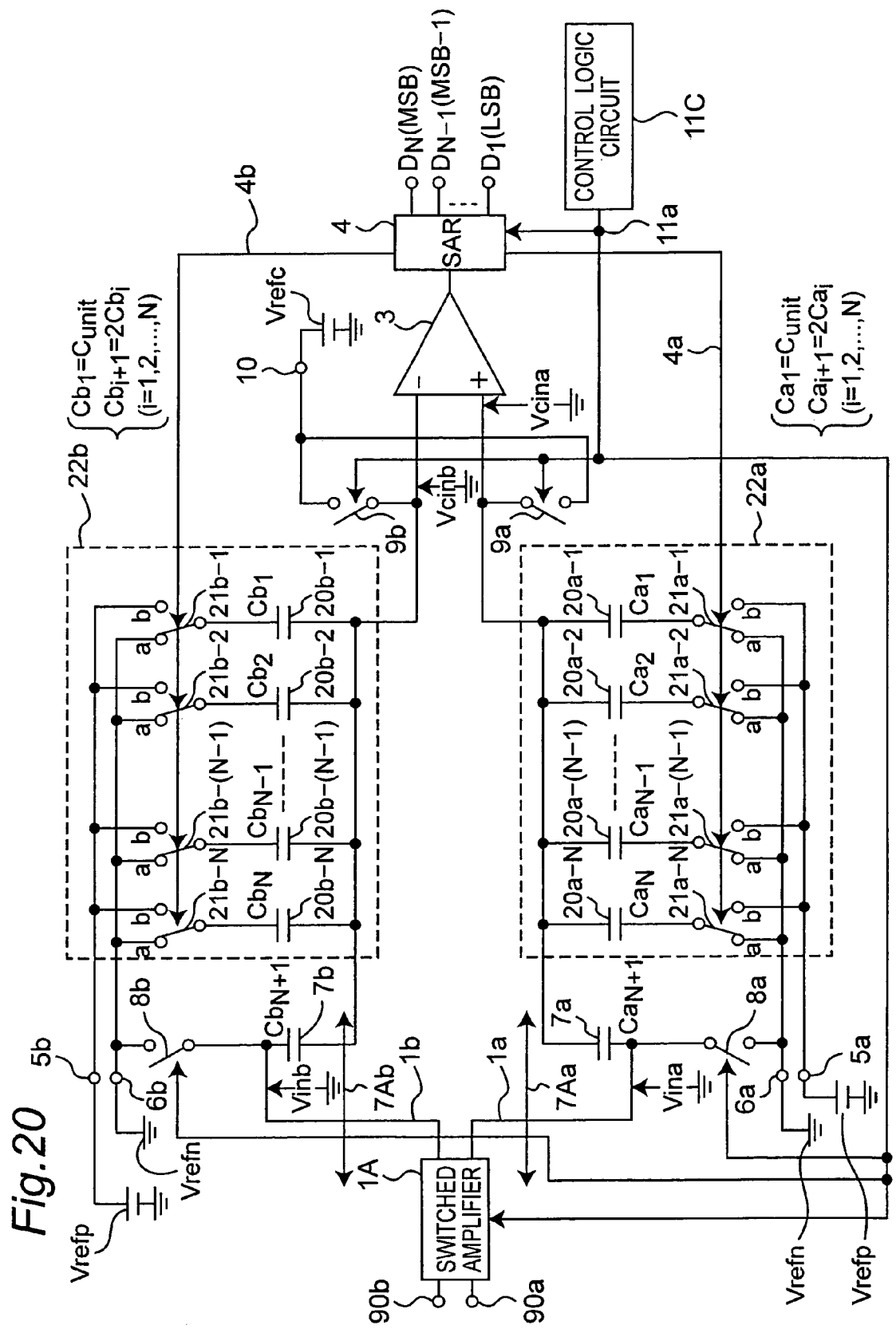
FIG. 20 is a circuit diagram showing a configuration of an AD converter circuit according to a sixth preferred embodiment of the present invention.
Figure 21:
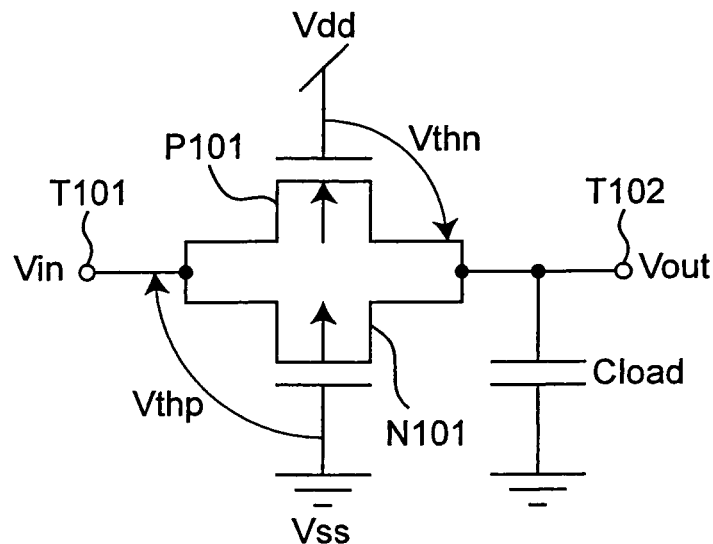
FIG. 21 is a circuit diagram showing a configuration of a CMOS analog switch circuit according to a prior art example.
Figure 22:
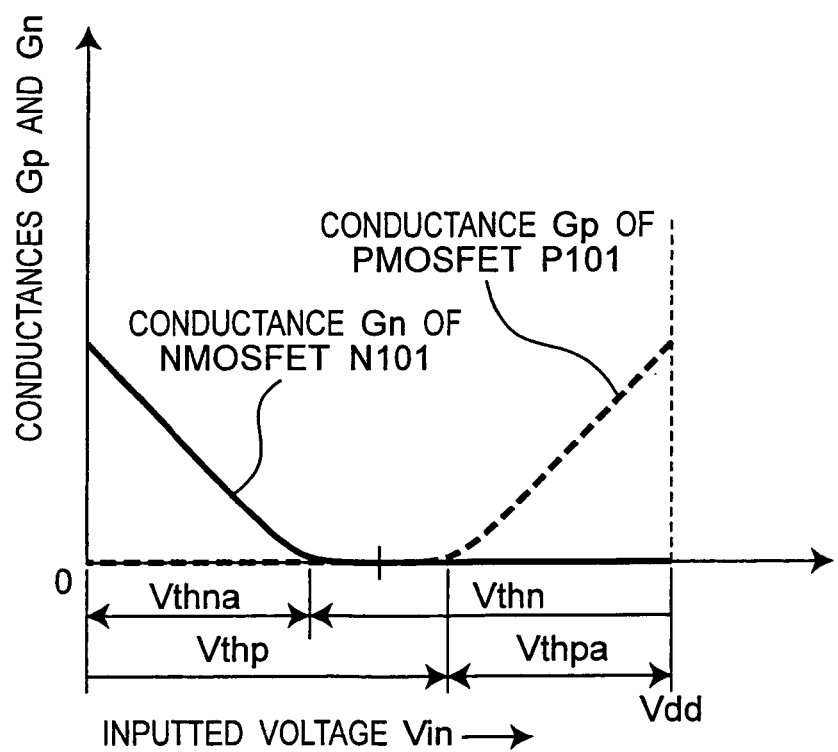
FIG. 22 is a graph showing an operation of the CMOS analog switch circuit shown in FIG. 21, and shows conductances Gp and Gn of MOSFETs P101 and N101 relative to an input voltage Vin.
Figure 23:
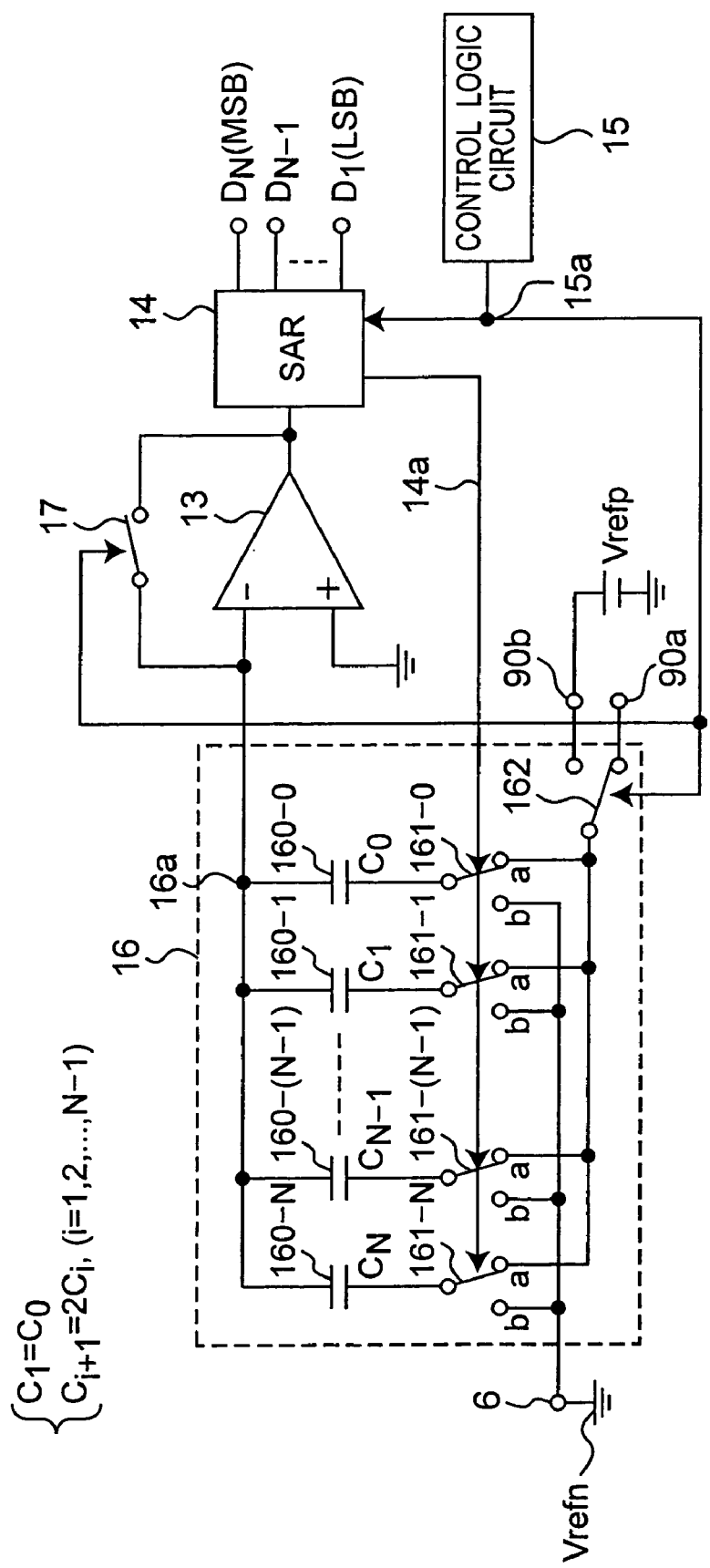
FIG. 23 is a circuit diagram showing a configuration of an AD converter circuit according to a first prior art example.
Figure 24:
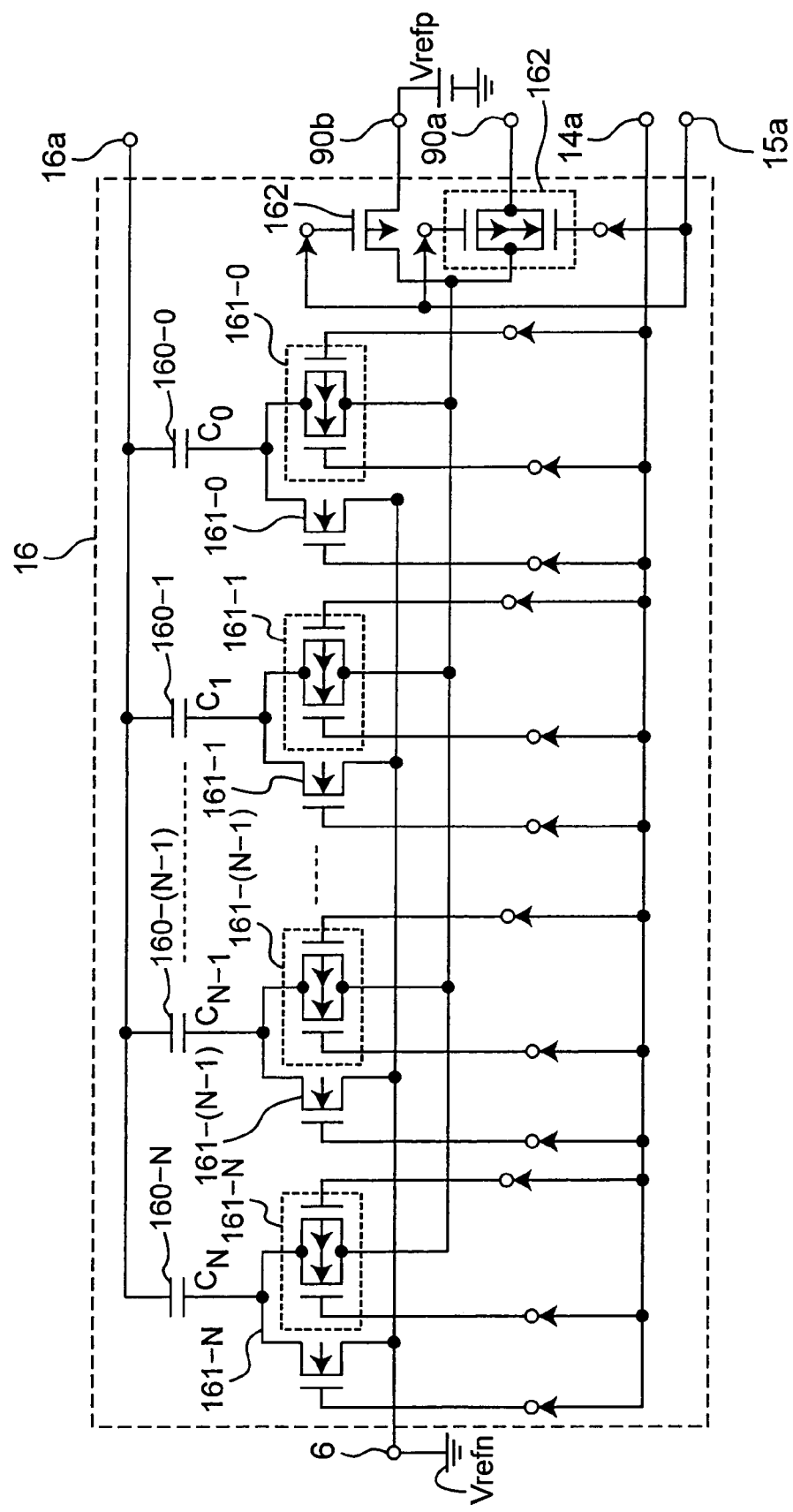
FIG. 24 is a circuit diagram showing a configuration of a DA converter 16 of capacitor array type shown in FIG. 23.

FIG. 20 is a circuit diagram showing a configuration of an AD converter circuit according to a sixth preferred embodiment of the present invention. The AD converter circuit according to the sixth preferred embodiment differs from that according to the first preferred embodiment shown in FIG. 1 in the following respects.

(1) The AD converter circuit includes a switched amplifier 1A that includes differential input terminals 90a and 90b and differential output voltages 1a and 1b, in place of the switched amplifier 1.

(2) The AD converter circuit includes two hold capacitors 7a and 7b, in place of the hold capacitor 7.

(3) The AD converter circuit includes two switches 8a and 8b, in place of the switch 8.

(4) The AD converter circuit includes terminals 5a and 5b to which a reference voltage source Vrefp is connected, in place of the terminal 5.

(5) The AD converter circuit includes terminals 6a and 6b to which a ground potential Vrefn is connected, in place of the terminal 6.

(6) The AD converter circuit includes two DA converters 22a and 22b, in place of the DA converter 2. In this case, the DA converter 22a includes N capacitors 20a-1 to 20a-N and switches 21a-1 to 21a-N. Further, the DA converter 22b includes N capacitors 20b-1 to 20b-N and switches 21b-1 to 21b-N.

(7) The AD converter circuit includes two switches 9a and 9b, in place of the switch 9.

(8) The successive approximation register 4 controls switchover of switches 21a-1 to 21a-N and switches 21b-1 to 21b-N using control signals 4a and 4b.

(9) The AD converter circuit includes a control logic circuit 11C in place of the control logic circuit 11. The control logic circuit 11C controls the switched amplifier 1A, the switches 8a and 8b, and the switches 9a and 9b using a control signal 11a.

The AD converter circuit shown in FIG. 20 is constituted by configuring all the circuits of the AD converter circuit shown in FIG. 1 into those of differential circuit type. In a manner similar to that of the AD converter circuit shown in FIG. 1, the AD converter shown in FIG. 20 simultaneously controls positive-side circuits and negative-side circuits. In this case, the AD converter circuit can cancel the noises entering the AD converter circuit from a power supply and a substrate as common-mode noises, and is effective particularly when the present AD converter circuit is applied to a system LSI on which both of digital circuits and analog circuits are mounted.

INDUSTRIAL APPLICABILITY

As mentioned above in details, the analog to digital converter circuit according to the present invention can realize the switched amplifier by the grounded switches operating at the low voltage, namely, by a rail to rail amplifier operable at input and output voltages in a range from the ground potential to the power supply voltage. Further, by outputting the output voltage from the hold capacitor of the sample hold circuit as the output voltage from the digital to analog converter via the common terminal thereto, and comparing the output voltage from the digital to analog converter with the appropriately set third potential using the comparator, the analog to digital converter circuit according to the present invention can perform a successive approximation operation and the digital to analog conversion. Since it suffices that the comparator detects only the difference between the reference voltage having the third potential and the output voltage from the digital to analog converter, the comparator can be configured by a simple circuit configuration. In addition, since the analog to digital converter circuit does not depend on a direct-current voltage of the input analog signal, the input voltage range of the analog to digital converter circuit can be set to the range from the ground potential to the voltage of the power supply voltage source. In the other words, the analog to digital converter circuit according to the present invention can operate at the power supply voltage equal to or lower than 1 V, and enlarges the input analog signal voltage range to the range from the ground potential to the voltage of the power supply voltage source. In addition, the analog to digital converter circuit can realize the comparator by the comparator having the narrow common-mode input voltage range, and execute a high-accuracy conversion without any influence of the offset voltage of the comparator and any influence of the parasitic capacitor of the capacitor array.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An analog to digital converter circuit comprising:
   a sample hold circuit for sampling and holding an input analog signal;
   a digital to analog converter for converting a digital value into an analog voltage, and outputting the analog voltage;
   a comparator for comparing the input analog voltage with the analog voltage from said digital to analog converter, and outputting a comparison result signal;
   a successive approximation register for holding the comparison result signal from said comparator, and outputting a held digital value thereof; and
   a controller for controlling an operation of said analog to digital converter circuit,
   wherein said digital to analog converter is of capacitor array type and includes:
   a plurality of capacitors each having one end connected to a common terminal, said capacitors having capacitances different from each other, respectively; and
   a plurality of switches for switching over said plurality of capacitors so as to select one of the capacitors,
   wherein said sample hold circuit includes:
   a switched amplifier operable to switch over its operation so as to select one of an operation of sampling and outputting the input analog signal and another operation of setting an output terminal of the switched amplifier into a high-impedance state; and
   a hold capacitor having one end and another end connected in series to a common terminal of said respective capacitors, said hold capacitor holding the sampled input analog signal outputted from said switched amplifier, and
   wherein, during sampling and holding of the input analog signal, said controller connects another end of each of the capacitors of said digital to analog converter to a first potential, and outputs the sampled input analog signal from said switched amplifier to the one end of said hold capacitor so that said hold capacitor holds the sampled input analog signal,
   wherein, thereafter, during successive approximation of the comparison result signal, said controller controls said switched amplifier so that the output terminal of said switched amplifier is set into the high-impedance state, controls to connect the one end of said hold capacitor to the first potential, successively switches over connection of another end of each of the capacitors of said digital to analog converter from the first potential to a second potential higher than the first potential based on the digital value held by the successive approximation register to output an output voltage from another end of said hold capacitor to said comparator as the output voltage from said digital to analog converter, and controls said comparator to compare the output voltage from another end of said hold capacitor with a third potential that is a potential between the first potential and the second potential to obtain a digital value from the successive approximation register.

2. An analog to digital converter circuit comprising:
   a sample hold circuit for sampling and holding an input analog voltage;
   a digital to analog converter for converting a digital value into an analog voltage, and outputting the analog voltage;
   a comparator for comparing the input analog voltage with the analog voltage from said digital to analog converter, and outputting a comparison result signal;
   a successive approximation register for holding the comparison result signal from said comparator, and outputting a held digital value; and
   a controller for controlling an operation of the analog to digital converter circuit,
   wherein said digital to analog converter is of capacitor array type and includes:

a plurality of capacitors each having one end connected to a common terminal, said capacitors having capacitances different from each other, respectively; and a plurality of switches for switching over said plurality of capacitors so as to select one of the capacitors, wherein said sample hold circuit includes:

a switched amplifier operable to switch over its operation so as to select one of an operation of sampling and outputting the input analog signal and another operation of setting an output terminal of the switched amplifier into a high-impedance state; and a hold capacitor having one end and another end connected in series to a common terminal of said respective capacitors, said hold capacitor holding the sampled input analog signal outputted from said switched amplifier, and wherein, during sampling and holding, said controller connects another end of each of the capacitors of said digital to analog converter to a second potential higher than a first potential, and outputs the sampled input analog signal from said switched amplifier to the one end of said hold capacitor so that said hold capacitor holds the sampled input analog signal, and wherein, thereafter, during successive approximation, said controller controls said switched amplifier so that the output terminal of said switched amplifier is set into the high-impedance state, and controls the one end of said hold capacitor to be connected to the second potential, successively switches over connection of another end of each of the capacitors of said digital to analog converter from the second potential to the first potential based on the digital value held by the successive approximation register to output an output voltage from another end of said hold capacitor to said comparator as the output voltage from said digital to analog converter, and controls said comparator to compare the output voltage from another end of said hold capacitor with a third potential that is a potential between the first potential and the second potential to obtain a digital value from the successive approximation register.

3. The analog to digital converter circuit as claimed in claim 1, further comprising an additional hold capacitor being connected in parallel to said hold capacitor during the successive approximation.

4. The analog to digital converter circuit as claimed in claim 2, further comprising an additional hold capacitor being connected in parallel to said hold capacitor during the successive approximation.

5. The analog to digital converter circuit as claimed in claim 1, wherein said switched amplifier is configured such that the output voltages of the same number as the number of said plurality of capacitors of said digital to analog converter are outputted to and held by the respective capacitors of said digital to analog converter.

6. The analog to digital converter circuit as claimed in claim 2, wherein said switched amplifier is configured such that the output voltages of the same number as the number of said plurality of capacitors of said digital to analog converter are outputted to and held by the respective capacitors of said digital to analog converter.

7. The analog to digital converter circuit as claimed in claim 1, wherein said sample hold circuit and said digital to analog converter of said analog to digital converter circuit are configured by differential circuits, respectively, so that differential input analog signals are converted into digital values.

8. The analog to digital converter circuit as claimed in claim 2, wherein said sample hold circuit and said digital to analog converter of said analog to digital converter circuit are configured by differential circuits, respectively, so that differential input analog signals are converted into digital values.

9. The analog to digital converter circuit as claimed in claim 1, wherein said analog to digital converter circuit is configured by a CMOS circuit that includes P channel MOSFETs and N channel MOSFETs, wherein the first potential is set to one potential in a range from a ground potential to a potential represented by {(the ground potential)+(a threshold voltage of each of the N channel MOSFETs)}, and wherein the second potential is set to one potential in a range from a positive power supply voltage to a potential represented by {(the positive power supply voltage)−(an absolute values of a threshold voltage of each of the P channel MOSFETs)}.

10. The analog to digital converter circuit as claimed in claim 2, wherein said analog to digital converter circuit is configured by a CMOS circuit that includes P channel MOSFETs and N channel MOSFETs, wherein the first potential is set to one potential in a range from a ground potential to a potential represented by {(the ground potential)+(a threshold voltage of each of the N channel MOSFETs)}, and wherein the second potential is set to one potential in a range from a positive power supply voltage to a potential represented by {(the positive power supply voltage)−(an absolute values of a threshold voltage of each of the P channel MOSFETs)}.

* * * * *